United States Patent

Kumagai

[11] Patent Number: 6,140,161
[45] Date of Patent: Oct. 31, 2000

[54] SEMICONDUCTOR INTEGRATED CIRCUIT DEVICE AND METHOD FOR MAKING THE SAME

[75] Inventor: Kouichi Kumagai, Tokyo, Japan

[73] Assignee: NEC Corporation, Tokyo, Japan

[21] Appl. No.: 09/092,001

[22] Filed: Jun. 5, 1998

[30] Foreign Application Priority Data

Jun. 6, 1997 [JP] Japan .................................. 9-149237

[51] Int. Cl.⁷ ............................ H01L 21/00; H01L 21/84
[52] U.S. Cl. ............................ 438/154; 438/199; 438/527
[58] Field of Search .................................. 438/128, 149, 438/197, 154, 164, 231, 232, 199, 479, 517, 527; 257/351, 55

[56] References Cited

U.S. PATENT DOCUMENTS

| | | | |
|---|---|---|---|
| 5,273,915 | 12/1993 | Hwang et al. | 438/34 |
| 5,543,338 | 8/1996 | Shimoji . | |
| 5,767,549 | 6/1998 | Chen et al. | 257/347 |
| 5,925,915 | 7/1999 | Liu et al. | 257/351 |
| 5,970,331 | 10/1999 | Gardner et al. | 438/199 |

FOREIGN PATENT DOCUMENTS

| | | |
|---|---|---|
| 60-57643 | 4/1985 | Japan . |
| 60-92653 | 5/1985 | Japan . |
| 61-234546 | 10/1986 | Japan . |
| 4-257267 | 9/1992 | Japan . |
| 6-112483 | 4/1994 | Japan . |

OTHER PUBLICATIONS

Raynaud et al., "Sub–0.25 μm Ultra–Thin SOI CMOS With A Single N+ Gate process For Low–Voltage And Low–Power Applications", *Proceedings 1996 IEEE International SOI Conference*, pp. 80, (1996).

*Primary Examiner*—Matthew Smith
*Assistant Examiner*—Calvin Lee
*Attorney, Agent, or Firm*—Foley & Lardner

[57] ABSTRACT

Disclosed is a method for making a semiconductor integrated circuit device used to form a p-channel MOS field-effect transistor and a n-channel MOS field-effect transistor on a common SOI substrate with a structure that a first silicon layer, insulating film and a second silicon layer are layered;
wherein the steps from sectioning a SOI layer as the second silicon layer by insulation separation into a plurality of active regions to forming at least one gate electrode to be laid through gate insulating film on the surface of each of the plurality of active regions are conducted with no relation to the conductivity type of MOS field-effect transistor.

25 Claims, 24 Drawing Sheets

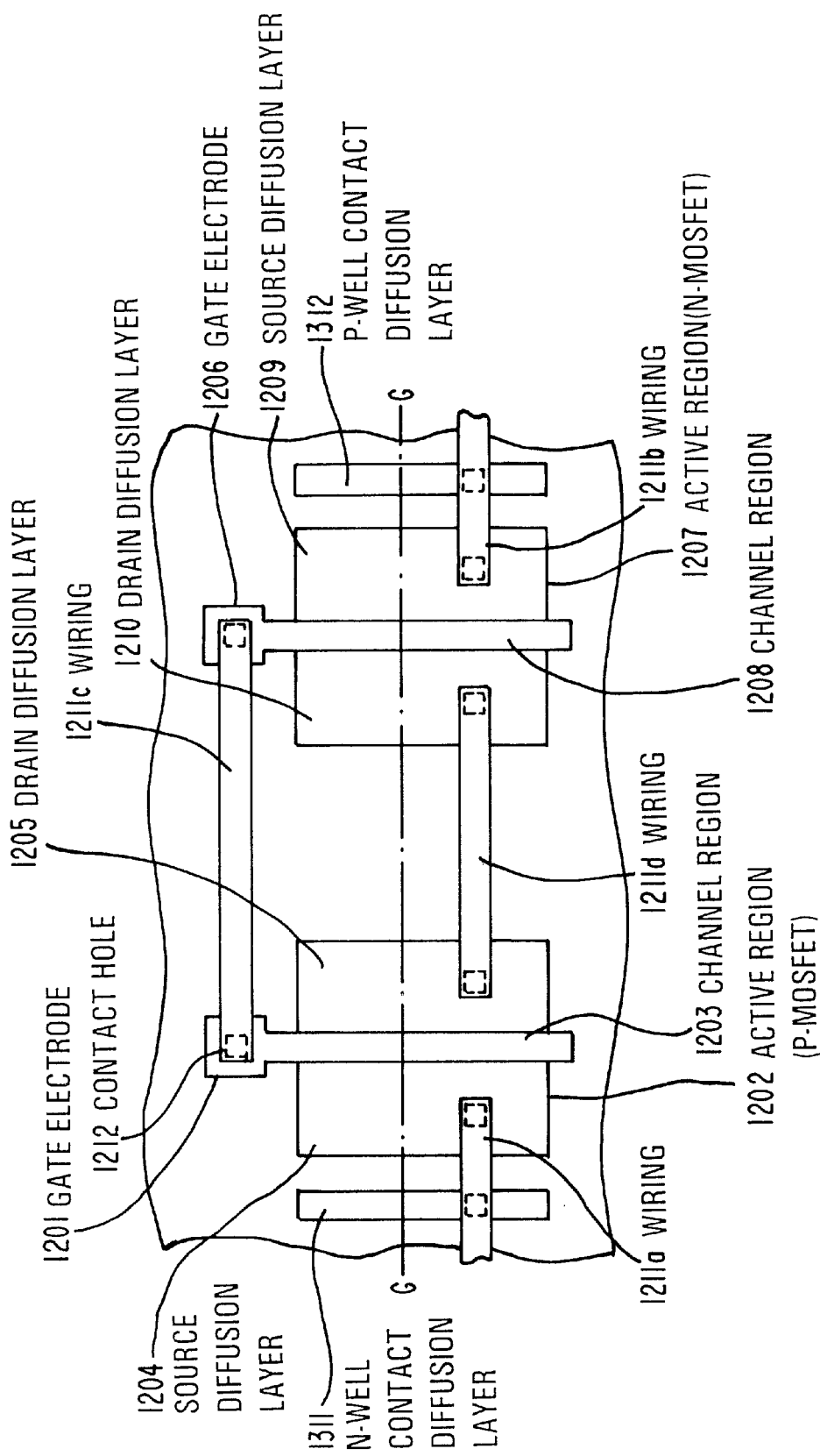

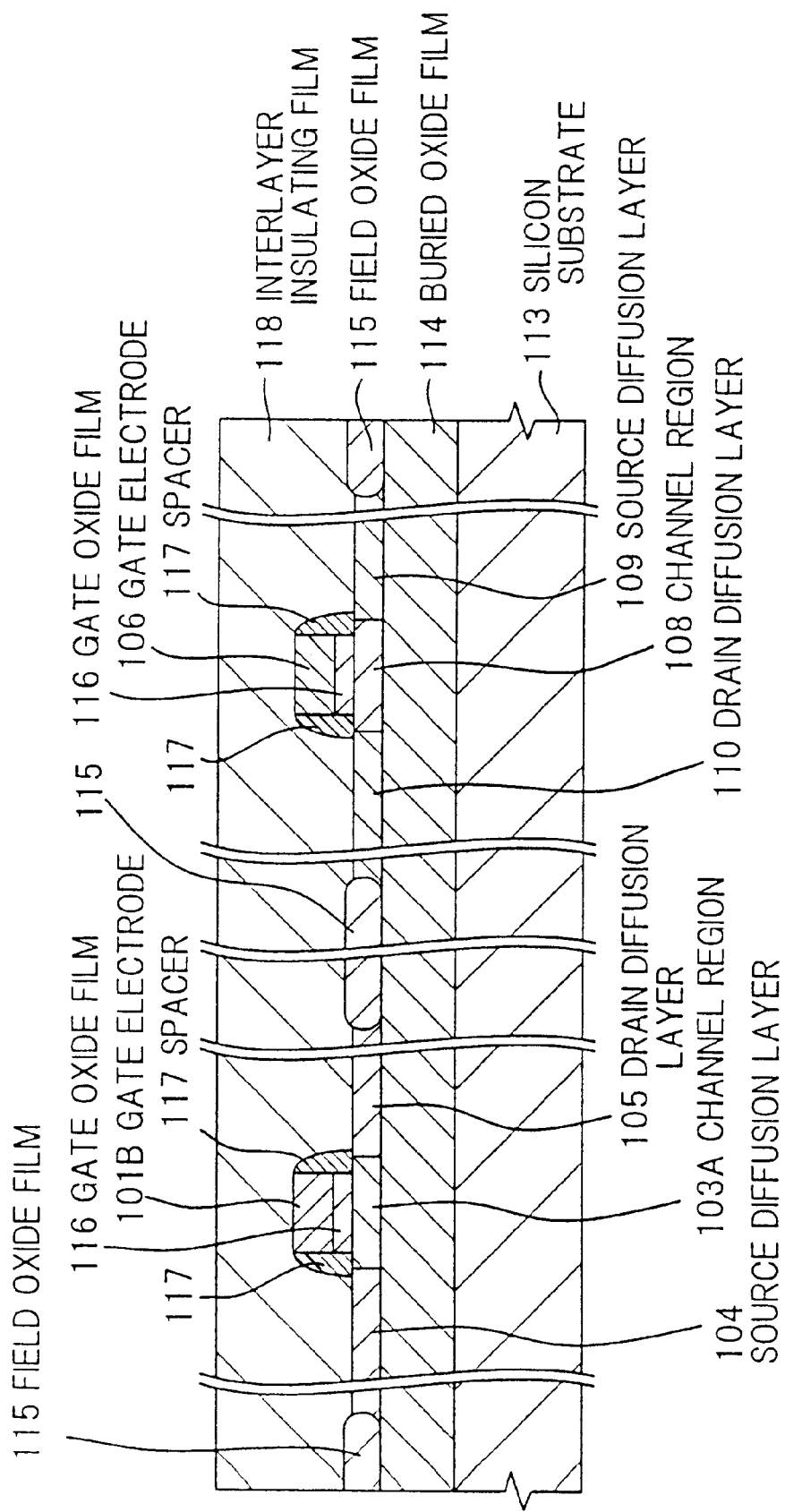

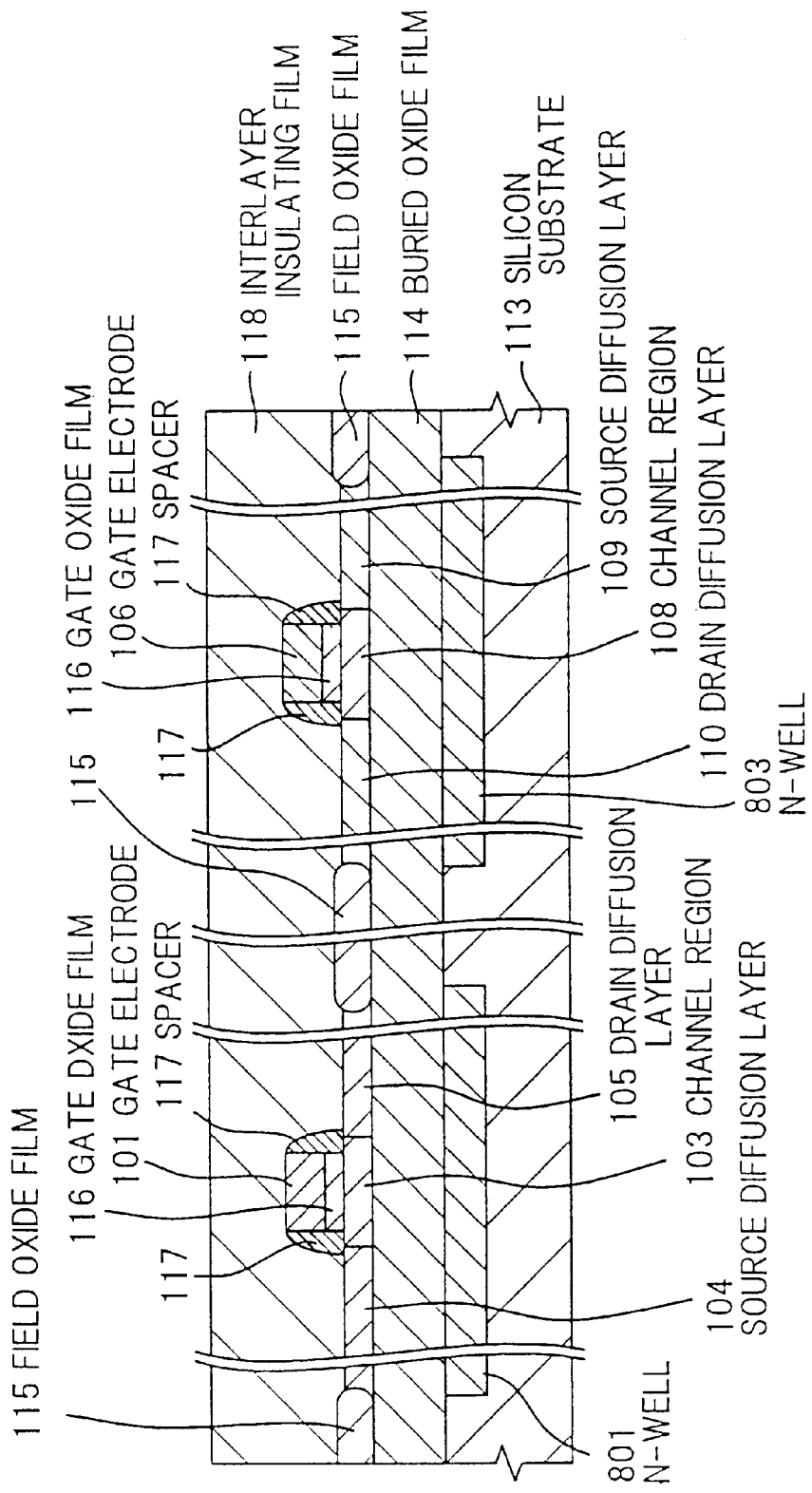

6,140,161

SEMICONDUCTOR INTEGRATED CIRCUIT DEVICE AND METHOD FOR MAKING THE SAME

FIELD OF THE INVENTION

This invention relates to a semiconductor integrated circuit device and a method for making the same, and more particularly to, a method for making a CMOS integrated circuit device on a SOI (silicon on insulator) substrate and a master-slice type semiconductor integrated circuit device and a method for making the same.

BACKGROUND OF THE INVENTION

In general, a conventional process of fabricating a CMOS semiconductor integrated circuit device that a CMOS circuit is formed on an ordinary silicon substrate requires eight patterns of patterning masks for forming (1) field oxide film, (2) n-well, (3) p-well, (4) gate electrode, (5) p-LDD layer, (6) n-LDD layer, (7) p-source, drain diffusion layers, and (8) n-source, drain diffusion layers, from the start of the process until the formation of transistor before the wiring process.

On the other hand, in a conventional SOI MOSFET fabrication process that a CMOS circuit is formed on a SOI substrate, the number of patterning masks can be reduced to a degree because well-forming steps are not necessary. However, the SOI substrate is more expensive than the silicon substrate. Therefore, for the purpose of reducing the manufacturing cost, it is desired that the number of steps in the SOI MOSFET fabrication process be further decreased.

Also, a CMOS master-slice type semiconductor integrated circuit device comprising an array of basic cells, each of which is composed of several MOSFETs, has been developed.

Thus, the first problem is that the conventional CMOS integrated circuit device using SOI substrate must have a high manufacturing cost. This is because SOI substrates are three to five times expensive comparing to ordinary silicon substrates. Therefore, the cost-down effect in fabricating the conventional CMOS integrated circuit device using SOI substrate, which is brought by that the well-forming process is omitted, is canceled by the high manufacturing cost of SOI substrate.

The second problem is that the integration density of elements must be reduced when the conventional CMOS master-slice type circuit is formed on silicon substrate or SOI substrate. This is because the conductivity type of MOSFET channel cannot be changed in the customizing process. Namely, the conductivity type of active-region channel of MOSFET is determined at the time of well-forming in case of bulk CMOS and at the time of ion-implantation for adjusting Vt in case of SOI CMOS. Thus, the conductivity type of MOSFET channel is determined before the customizing process.

SUMMARY OF THE INVENTION

Accordingly, it is an object of the invention to provide a method for making a semiconductor integrated circuit device using SOI substrate that the number of steps is further decreased to reduce the manufacturing cost.

It is a further object of the invention to provide a master-slice type semiconductor integrated circuit device using SOI substrate that the integration density of elements is enhanced.

It is a still further object of the invention to provide a method for making a master-slice type semiconductor integrated circuit device using SOI substrate that the integration density of elements is enhanced and the number of steps is further decreased to reduce the manufacturing cost.

According to the invention, provided is a method for making a semiconductor integrated circuit device used to form a p-channel MOS field-effect transistor and a n-channel MOS field-effect transistor on a common SOI substrate with a structure that a first silicon layer, insulating film and a second silicon layer are layered;

wherein the steps from sectioning a SOI layer as the second silicon layer by insulation separation into a plurality of active regions to forming at least one gate electrode to be laid through gate insulating film on the surface of each of the plurality of active regions are conducted with no relation to the conductivity type of MOS field-effect transistor.

According to another aspect of the invention, a master-slice type semiconductor integrated circuit device, comprises:

basic cells composed of a p-channel MOS field-effect transistor and/or a n-channel MOS field-effect transistor disposed in a plurality of adjacent active regions, the basic cells being formed on a SOI substrate that a first silicon layer, insulating film and a second silicon layer are layered;

wherein the arrangement of gate electrode on the active regions is common, and the master-slice type semiconductor integrated circuit device has different kinds of basic cells with different combinations of a p-channel MOS field-effect transistor and/or a n-channel MOS field-effect transistor.

According to another aspect of the invention, a method for making a master-slice type semiconductor integrated circuit device, comprises the steps of:

preparing a master substrate by conducting the steps from sectioning a SOI layer as a second silicon layer by insulation separation into a plurality of pairs of active regions to forming at least one gate electrode to be laid through gate insulating film on the surface of each of the plurality of active regions with no relation to the conductivity type of MOS field-effect transistor; and customizing the master substrate according to a circuit desired by customers;

wherein the customizing step is conducted by disposing a p-channel MOS field-effect transistor and/or a n-channel MOS field-effect transistor in the pair of active region to form different kinds of basic cells with different combinations of a p-channel MOS field-effect transistor and/or a n-channel MOS field-effect transistor and conducting the wiring to a selected one of the basic cells.

BRIEF DESCRIPTION OF THE DRAWINGS

The invention will be explained in more detail in conjunction with the appended drawings, wherein:

FIG. 1A is a layout diagram showing a conventional CMOS semiconductor integrated circuit device formed on a silicon substrate, FIG. 11B is a cross sectional view cut along the line C—C in FIG. 11A, FIGS. 12A to 12E are cross sectional views showing a method of fabricating the device in FIGS. 11A and 11B, FIG. 13B is a cross sectional view cut along the line D—D in FIG. 13A, FIGS. 14A to 14E are cross sectional views showing a method of fabricating the device in FIGS. 13A and 13B.

DESCRIPTION OF THE PREFERRED EMBODIMENTS

Before explaining the preferred embodiments, the aforementioned conventional methods for making a semiconductor integrated circuit device will be explained in FIGS. 1A to 5C.

Figure 1B:
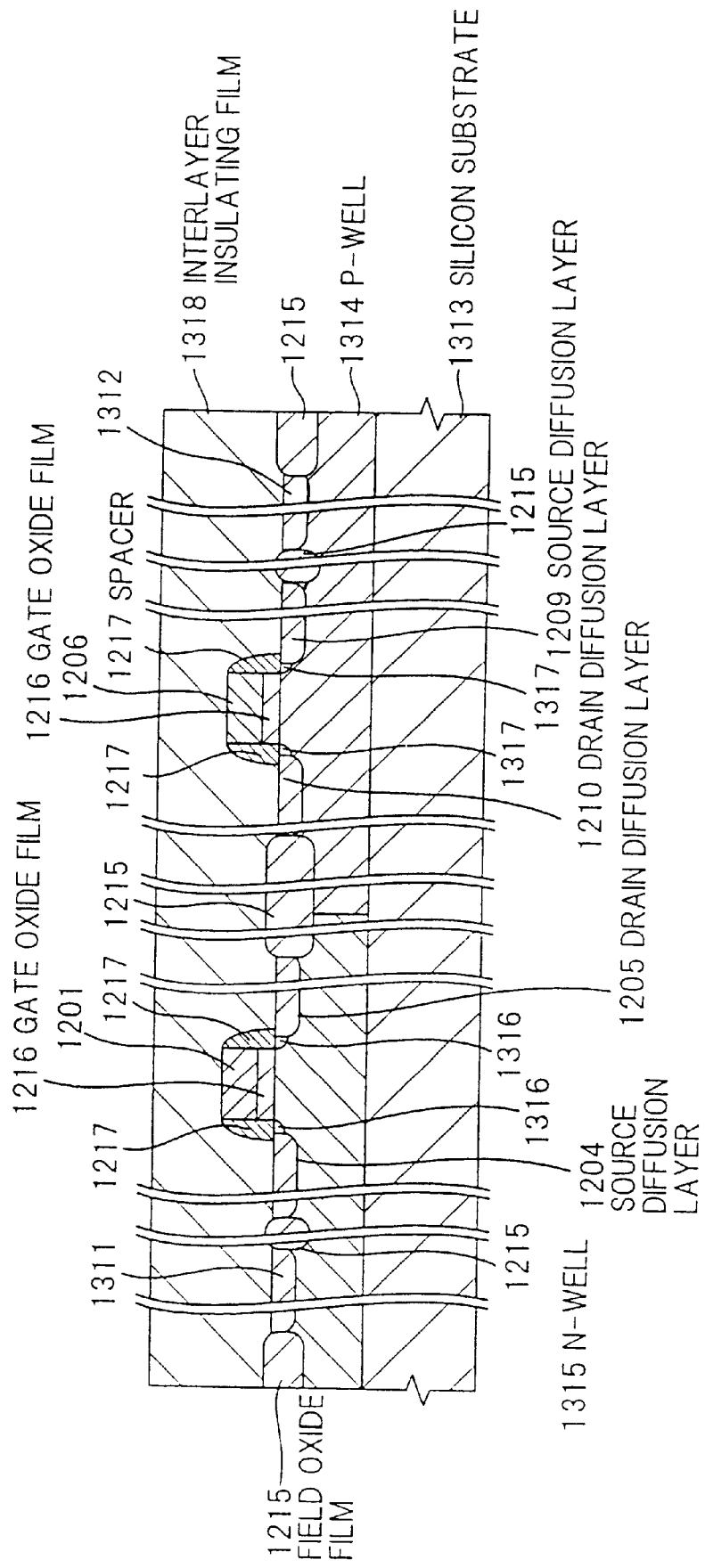
FIG. 1B is a cross sectional view cut along the line G—G in FIG. 1A, FIGS. 2A to 2E are cross sectional views showing a method of fabricating the device in FIGS. 1A and 1B.

At first, a conventional field-effect MOS transistor formed on a silicon substrate (hereinafter referred to as 'bulk MOSFET') will be explained in FIGS. 1A and 1B. FIG. 1A is a layout diagram showing an inverter circuit that a p-channel MOSFET (hereinafter referred to as 'p-MOSFET') and a n-channel MOSFET (hereinafter referred to as 'n-MOSFET') are formed on a common substrate. FIG. 1B is an enlarged cross sectional view cut along the line G—G in FIG. 1A. Meanwhile, in FIGS. 1A and 1B, a transistor with a LDD (lightly doped drain) structure is shown.

Referring to FIG. 1A, shown is a pattern composed of gate electrodes 1201, 1206, active regions 1202, 1207, a n-well contact diffusion layer 1311, a p-well contact diffusion layer 1312, wirings 1211a to 1211d, and a contact hole 1212. In the active region 1202 of p-MOSFET, a channel region 1203, a source diffusion layer 1204 and a drain diffusion layer 1205 are formed. Also, in the active region 1207 of n-MOSFET, a channel region 1208, a source diffusion layer 1209 and a drain diffusion layer 1210 are formed.

Figure 8:
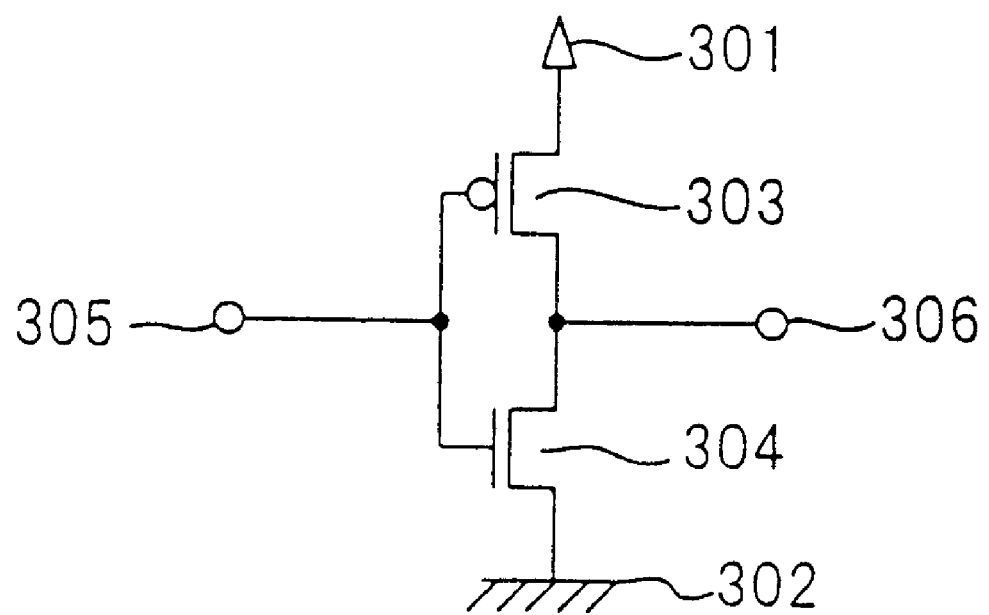
FIG. 8 is a circuit diagram showing a CMOS inverter circuit.
Figure 9A:
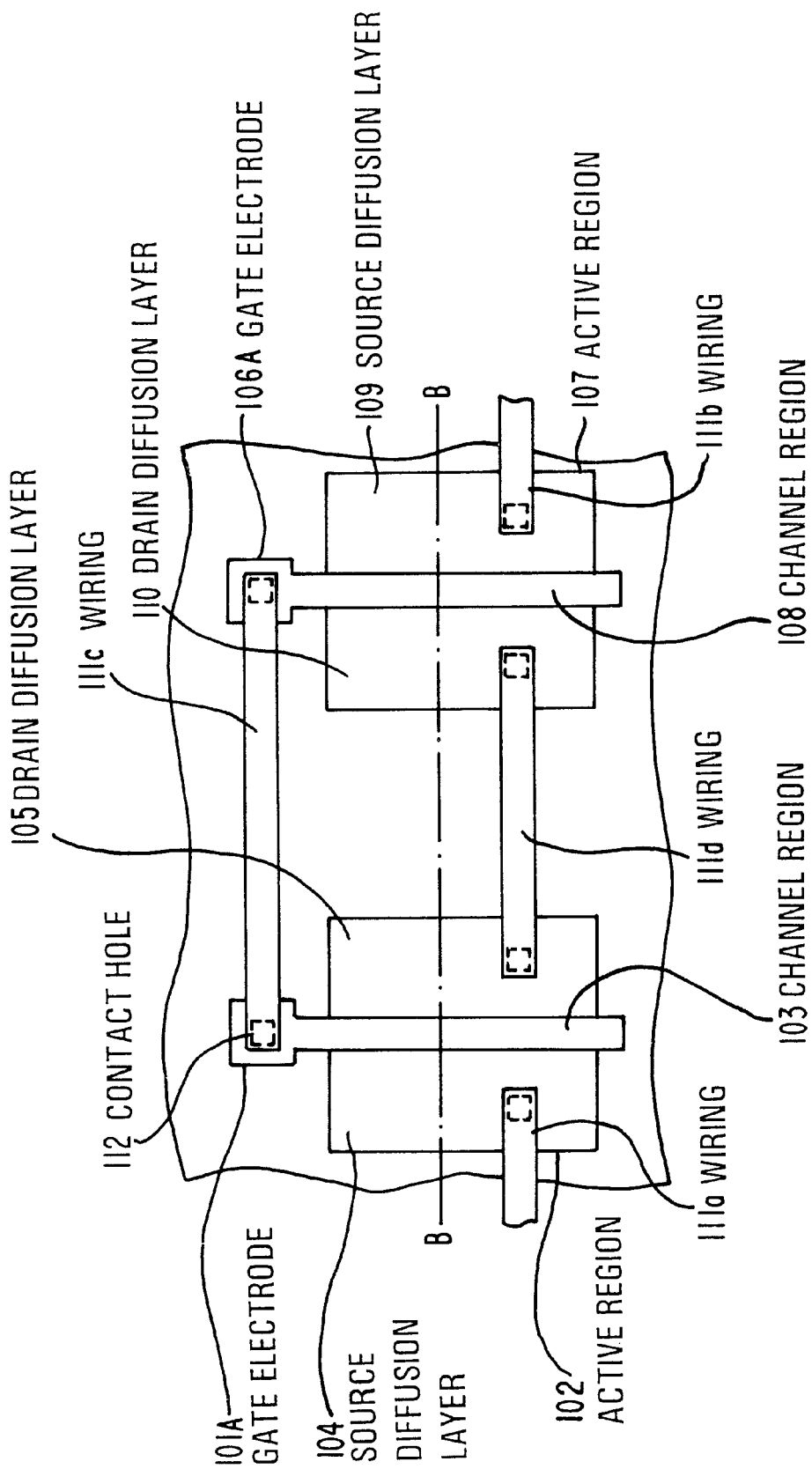
FIG. 9A is a layout diagram showing a CMOS semiconductor integrated circuit device in a second preferred embodiment according to the invention.
Figure 9B:
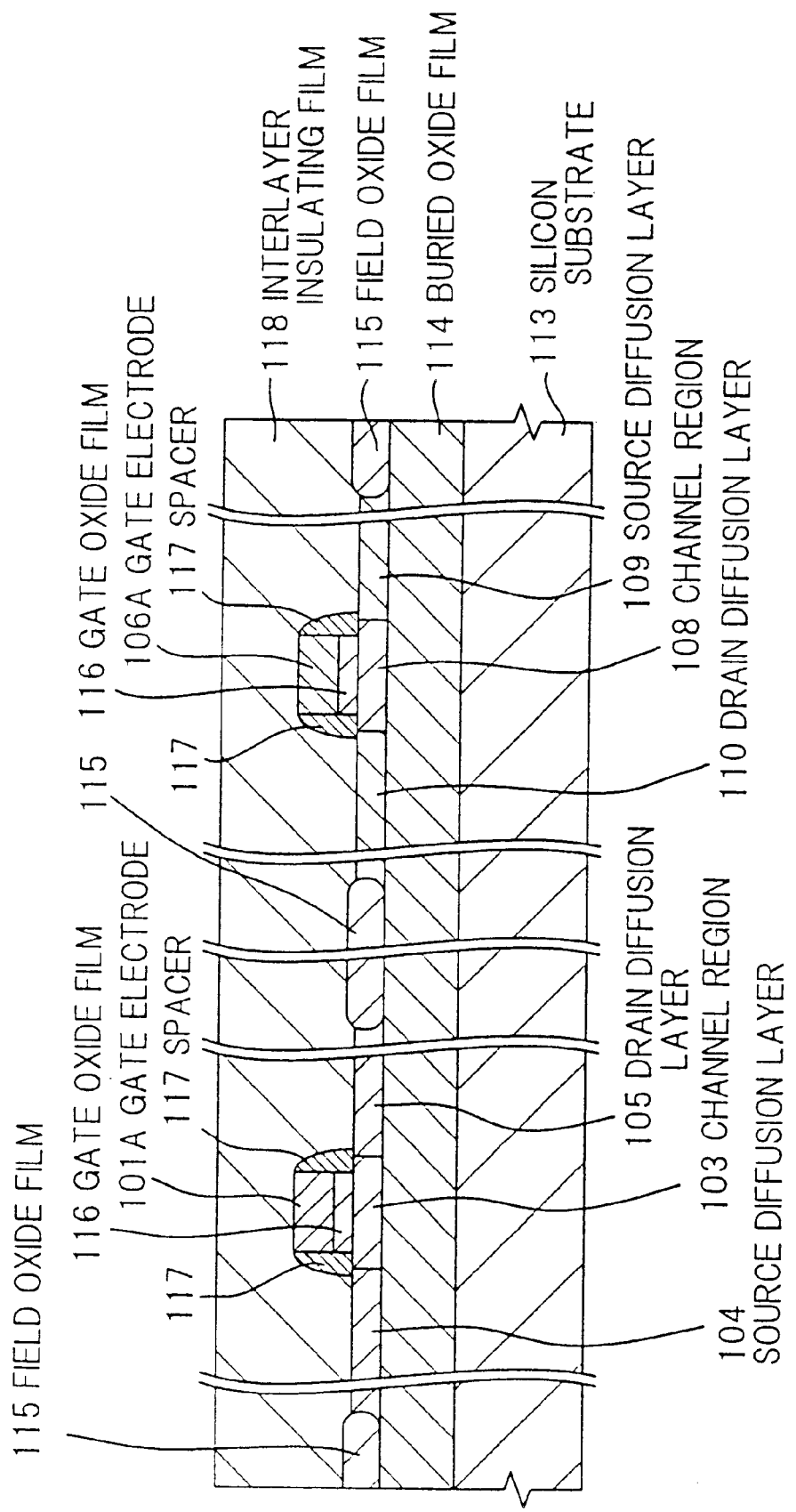
FIG. 9B is a cross sectional view cut along the line B—B in FIG. 9A, FIGS. 10A to 10E are cross sectional views showing a method of fabricating the device in FIGS. 9A and 9B.

A power source potential is supplied from the wiring 1211a through the contact hole 1212 to the n-well contact diffusion layer 1311 and the source diffusion layer 1204 of p-MOSFET, and a ground potential is supplied from the wiring 1211b through the contact hole 1212 to the p-well contact diffusion layer 1312 and the source diffusion layer 1209 of n-MOSFET. Also, the gate electrode 1201 of p-MOSFET is electrically connected through the wiring 1211c and contact hole 1212 to the gate electrode 1206 of n-MOSFET. The drain diffusion layer 1205 of p-MOSFET is electrically connected through the wiring 1211d and contact hole 1212 to the drain diffusion layer 1210 of n-MOSFET. Thus, an inverter circuit shown in FIG. 8 is composed.

Referring to FIG. 1B, shown is that both p-MOSFET and n-MOSFET in FIG. 1A are formed on n-well 1315 and p-well 1314, respectively, on a silicon substrate 1313. Gate oxide film 1216 is formed under the gate electrodes 1201, 1206 of p-MOSFET and n-MOSFET, spacers 1217 are formed on both sides thereof, and LDD layers 1316, 1317 are formed under the spacers 1217. Also, field oxide films 1215 are formed between the diffusion layers.

Figure 2A:
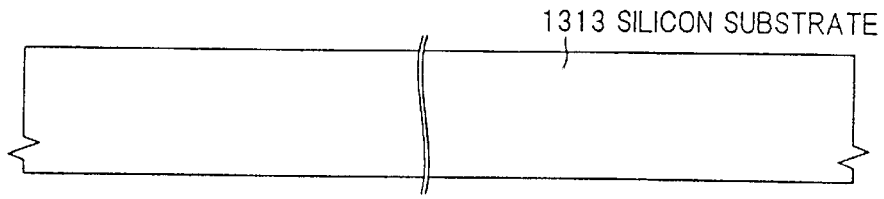
Figure 2B:
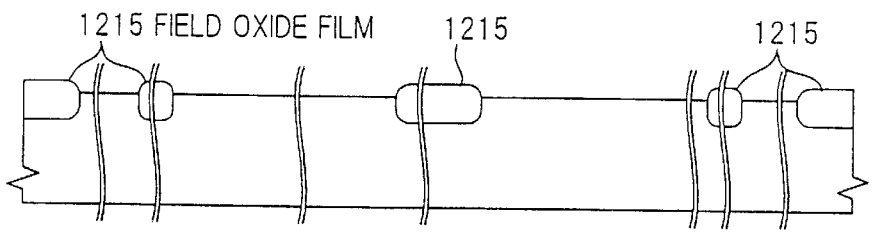

Next, the process of fabricating the bulk MOSFET will be explained in FIGS. 2A to 2E. The process is started using the silicon substrate 1313 shown in FIG. 2A. Then, by forming a buffer layer (not shown) and then patterning of the buffer layer by using a first mask and then conducting the thermal oxidation, the field oxide film 1215 is, as shown in FIG. 2B, formed. Thereby, the active regions and regions for well contact diffusion layer of MOSFET are determined.

Then, by patterning photoresist while using second and third masks and then ion-implanting selectively, the n-well 1315 and p-well 1314 are formed. Simultaneously, the ion-implanting for adjusting a threshold voltage (hereinafter referred to as 'Vt') for MOSFET is generally conducted to the surface of the active region. In forming the CMOS circuit on the silicon substrate, the region for p-MOSFET and the region for n-MOSFET are determined at the time of forming the wells as shown in FIG. 2C.

Figure 2C:
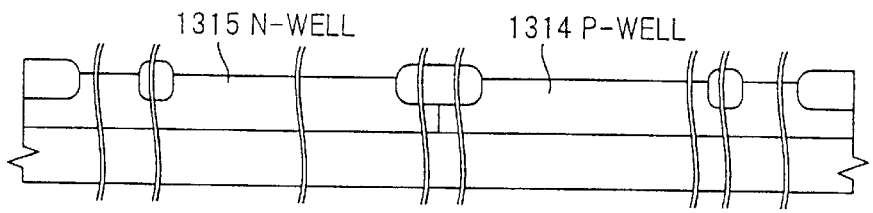
Figure 2D:
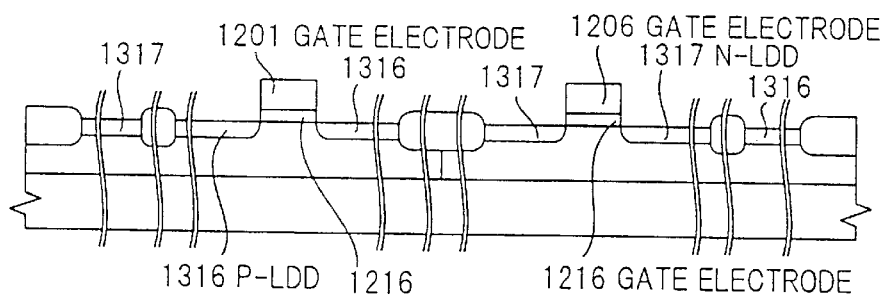
Figure 2E:
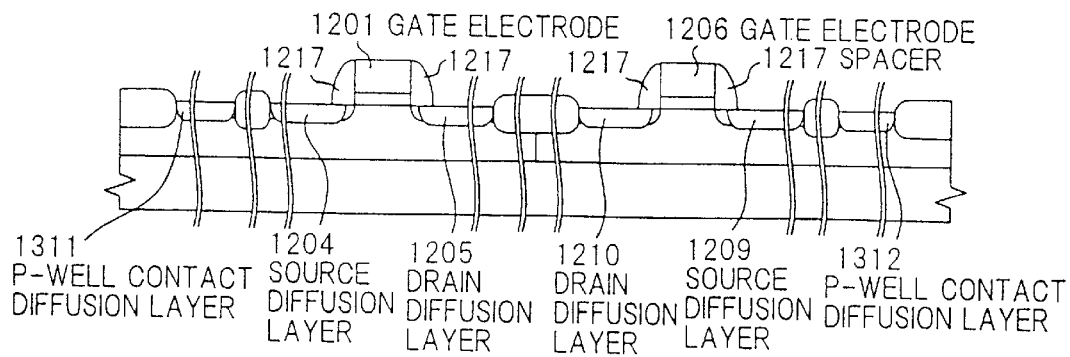

After forming the wells in FIG. 2C, the gate oxide film 1216 and gate polysilicon layer are grown. Then, as shown in FIG. 2D, they are patterned to form the gate electrodes 1201, 1206 by using a fourth mask. Further, by patterning photoresist by using fifth and sixth masks and then ion-implanting selectively, the p-LDD layer 1316 and n-LDD layer 1317 are formed.

Then, the spacer 1217 is formed on the sides of the gate electrode. Then, by patterning photoresist by using seventh and eighth masks and then ion-implanting selectively, the source, drain diffusion layers 1204, 1205 of p-MOSFET and the source, drain diffusion layers 1209, 1210 of n-MOSFET, the n-well contact diffusion layer 1311 and the p-well contact diffusion layer 1312 are formed. Also, by this ion-implanting, the gate electrode 1201 of p-MOSFET an the gate electrode 1206 of n-MOSFET are determined to be p-type and n-type conductivities, respectively.

Then, the wiring process follows. In case of a two-layer wiring process, interlayer insulating film 1318 is deposited, then the contact hole 1212 is formed, then the first wirings (1211a to 1211d) are formed. Further, by interlayer insulating film, a first through-hole, a mask for patterning the four patterns of the second wirings to be connected with 1211a to 1211d (which are not shown), the wiring process is completed.

As described above, the semiconductor integrated circuit device that the CMOS circuit is formed on the ordinary silicon substrate requires eight patterns of patterning masks for forming (1) field oxide film, (2) n-well, (3) p-well, (4) gate electrode, (5) p-LDD layer, (6) n-LDD layer, (7) p-source, drain diffusion layers, and (8) n-source, drain diffusion layers, from the start of the process until the formation of transistor before the wiring process. However, depending on the fabrication conditions, each of the respective pairs of (2) n-well, (3) p-well and (5) p-LDD layer, (6) n-LDD layer can be fabricated by using either of the two mask patterns. In this case, the number of mask patterns required from the start of the process until the formation of transistor before the wiring process is six. Also, when several Vt are set for p-MOSFET or n-MOSFET, masks to set the several Vt are required by the increment.

Figure 3A:
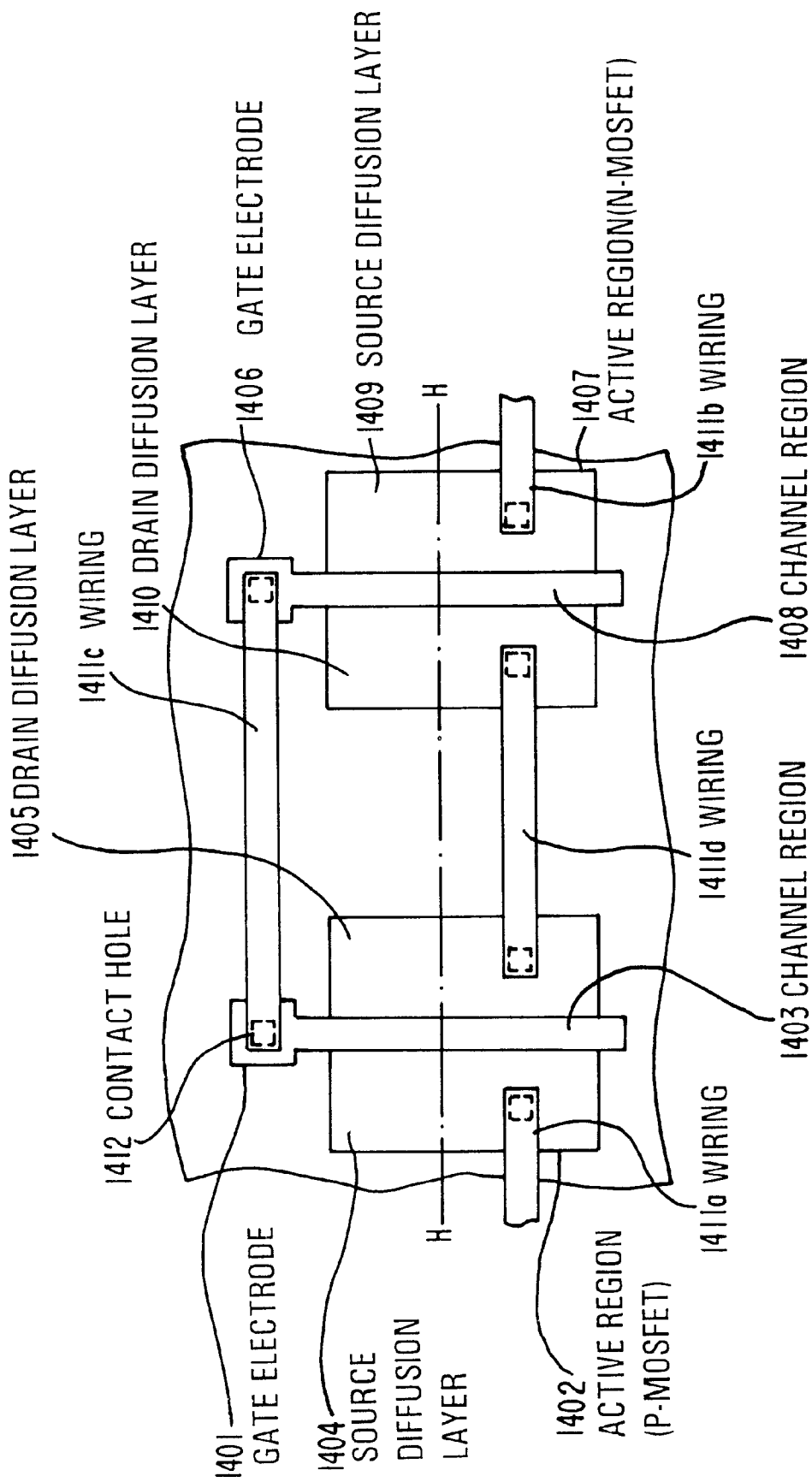
FIG. 3A is a layout diagram showing a conventional CMOS semiconductor integrated circuit device formed on an SOI substrate.
Figure 3B:
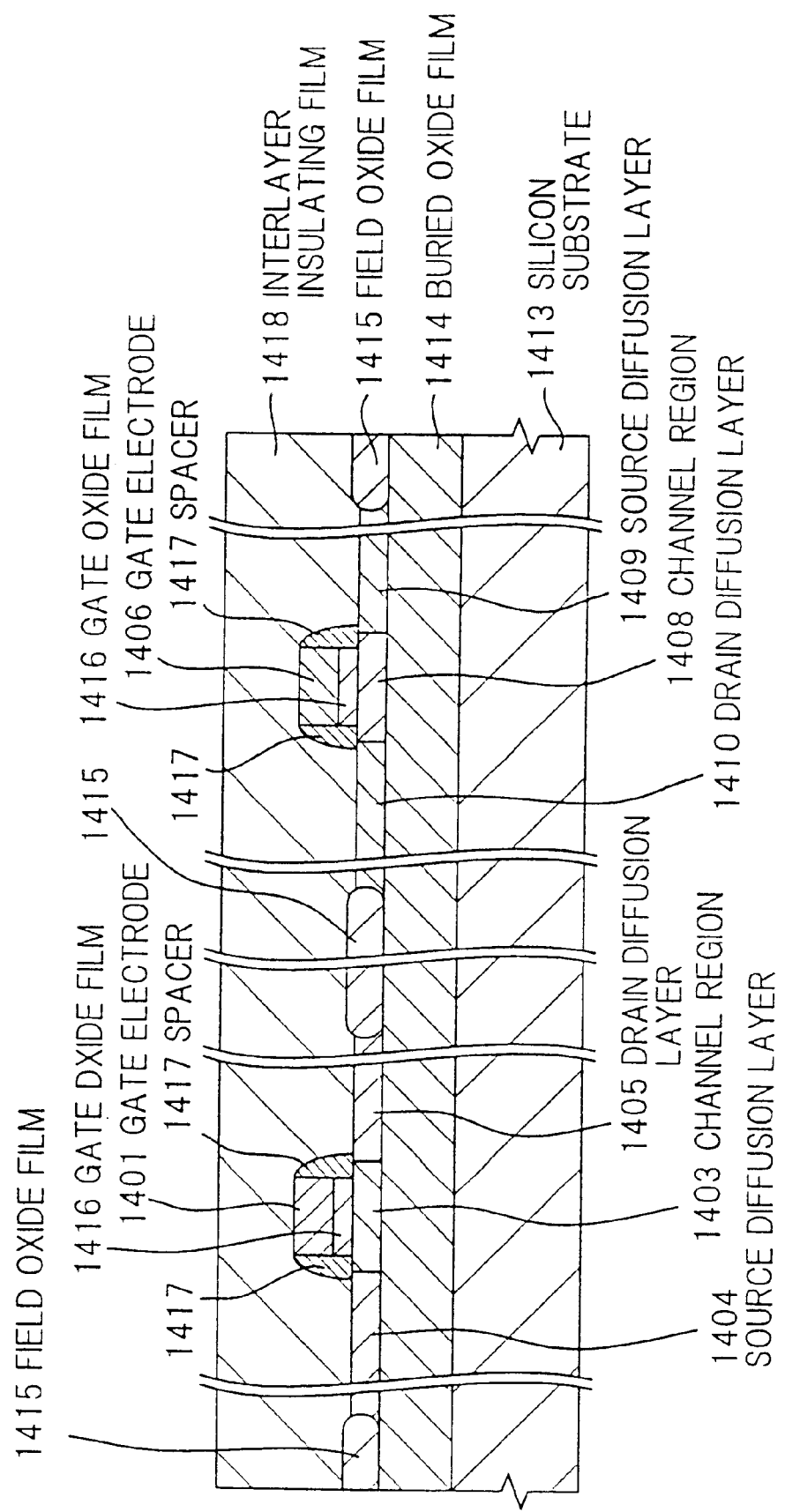
FIG. 3B is a cross sectional view cut along the line H—H in FIG. 3A, FIGS. 4A to 4E are cross sectional views showing a method of fabricating the device in FIGS. 3A and 3B.

Next, a conventional field-effect MOS transistor formed on an SOI (silicon on insulator) substrate (hereinafter referred to as 'SOI MOSFET') will be explained in FIGS. 3A and 3B. FIG. 3A is a layout diagram showing an inverter circuit that a p-MOSFET and a n-MOSFET are formed on a common substrate. FIG. 3B is an enlarged cross sectional view cut along the line H—H in FIG. 3A. Meanwhile, in FIGS. 3A and 3B, a transistor with a single drain structure is shown.

Referring to FIG. 3A, shown is a pattern composed of gate electrodes 1401, 1406, active regions 1402, 1407, wirings 1411a to 1411d, and a contact hole 1412. In the active region 1402 of p-MOSFET, a channel region 1403, a source diffusion layer 1404 and a drain diffusion layer 1405 are formed. Also, in the active region 1407 of n-MOSFET, a channel region 1408, a source diffusion layer 1409 and a drain diffusion layer 1410 are formed.

A power source potential is supplied from the wiring 1411a through the contact hole 1412 to the source diffusion layer 1404 of p-MOSFET, and a ground potential is supplied from the wiring 1411b through the contact hole 1412 to the source diffusion layer 1409 of n-MOSFET. Also, the gate electrode 1401 of p-MOSFET is electrically connected through the wiring 1411c and contact hole 1412 to the gate electrode 1406 of n-MOSFET. The drain diffusion layer 1405 of p-MOSFET is electrically connected through the wiring 1411d and contact hole 1412 to the drain diffusion layer 1410 of n-MOSFET. Thus, an inverter circuit shown in FIG. 8 is composed.

Referring to FIG. 3B, shown is that both p-MOSFET and n-MOSFET in FIG. 3A are formed on buried oxide film 1414 on a silicon substrate 1413. Gate oxide film 1416 is formed under the gate electrodes 1401, 1406 of p-MOSFET and n-MOSFET, and spacers 1417 are formed on both sides thereof. Also, field oxide films 1415 are formed between the diffusion layers.

When the CMOS circuit is formed on the SOI substrate, the device separation for the MOS transistors is enabled by the buried oxide film and LOCOS layer. Therefore, in this case, the n-well and p-well of the bulk CMOS shown in FIGS. 1A to 2E do not exist.

Figure 4A:
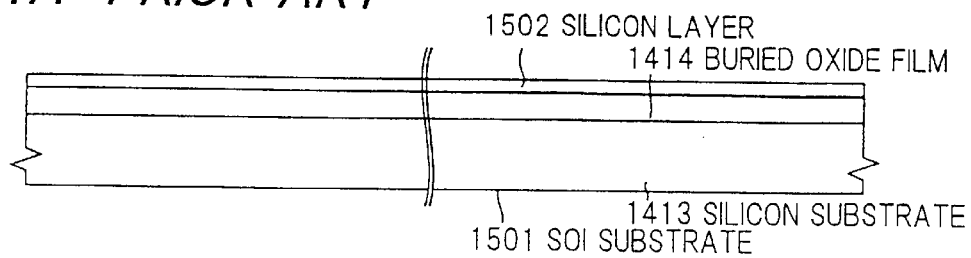
Figure 4B:
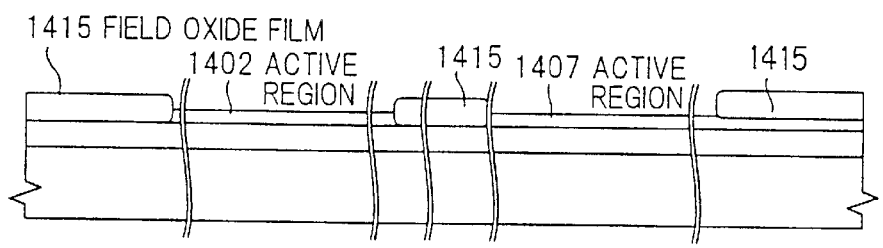

Next, the process of fabricating the SOI MOSFET will be explained in FIGS. 4A to 4E. The process is started using a SOI substrate 1501 shown in FIG. 4A. The SOI substrate 1501 is composed of the silicon substrate 1413, the buried oxide film 1414 formed on the silicon substrate 1413, and a silicon layer (hereinafter referred to as 'SOI layer') 1502 formed on the buried oxide film 1414. Then, the SOI layer 1502 is thermally oxidized and then is adjusted to have a desired thickness by, e.g., removing the oxide film. Then, by forming a buffer layer (not shown) and then patterning of the buffer layer by using a first mask and then conducting the thermal oxidation, the field oxide film 1415 is, as shown in FIG. 4B, formed. Thereby, the active regions for MOSFET in the SOI layer are determined.

Then, in general, by patterning photoresist while using second and third masks and then ion-implanting selectively, the ion-implanting for adjusting Vt of MOSFET is conducted to the active regions 1402, 1407 of the SOI layer. In forming the CMOS circuit on the SOI substrate, the n-active region 1402 for p-MOSFET and the p-active region 1407 for n-MOSFET are determined at the time of setting Vt as shown in FIG. 4B.

Figure 4C:
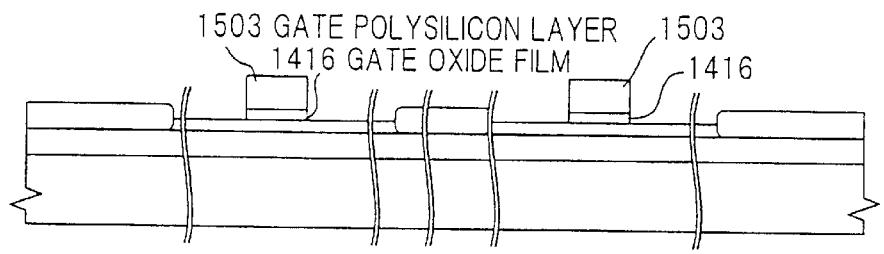

After adjusting Vt in FIG. 4B, the gate oxide film 1416 and a gate polysilicon layer 1503 are grown. Then, as shown in FIG. 4C, they are patterned to form the gate electrode 1401, 1406 by using a fourth mask.

Figure 4D:
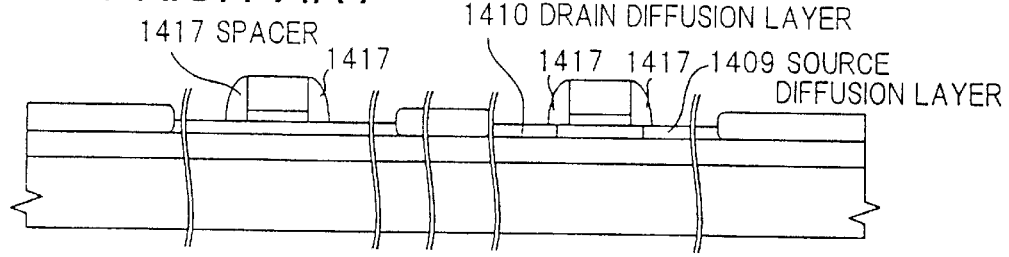
Figure 4E:
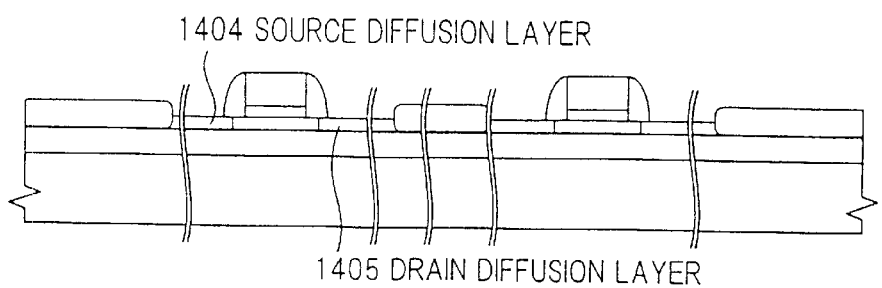

Then, as shown in FIG. 4D, the spacer 1417 is formed on the sides of the gate electrode. Then, by patterning photoresist by using a fifth mask and then ion-implanting selectively, the source/drain diffusion layers 1409, 1410 of n-MOSFET. Also, by patterning photoresist by using a sixth mask and then ion-implanting selectively, the source/drain diffusion layers 1404, 1405 of p-MOSFET are formed as shown in FIG. 4E. Also, by this ion-implanting, the gate electrode 1401 of p-MOSFET and the gate electrode 1406 of n-MOSFET are determined to be p-type and n-type conductivities, respectively.

Then, the wiring process follows. It is analogous to the case that the CMOS circuit is formed on the silicon substrate.

As described above, the semiconductor integrated circuit device that he CMOS circuit is formed on the SOI substrate requires six patterns of patterning masks for (1) field oxide film, (2) Vt setting of p-MOSFET (3) Vt setting of n-MOSFET, (4) gate electrode, (5) p-source, drain diffusion layers, and (6) n-source, drain diffusion layers, from the start of the process until the formation of transistor before the wiring process. However, depending on the fabrication conditions, each of (2) Vt setting of p-MOSFET and (3) Vt setting of n-MOSFET can be fabricated by using either of the two mask patterns. In this case, the number of mask patterns required from the start of the process until the formation of transistor before the wiring process is five.

Figure 5A:
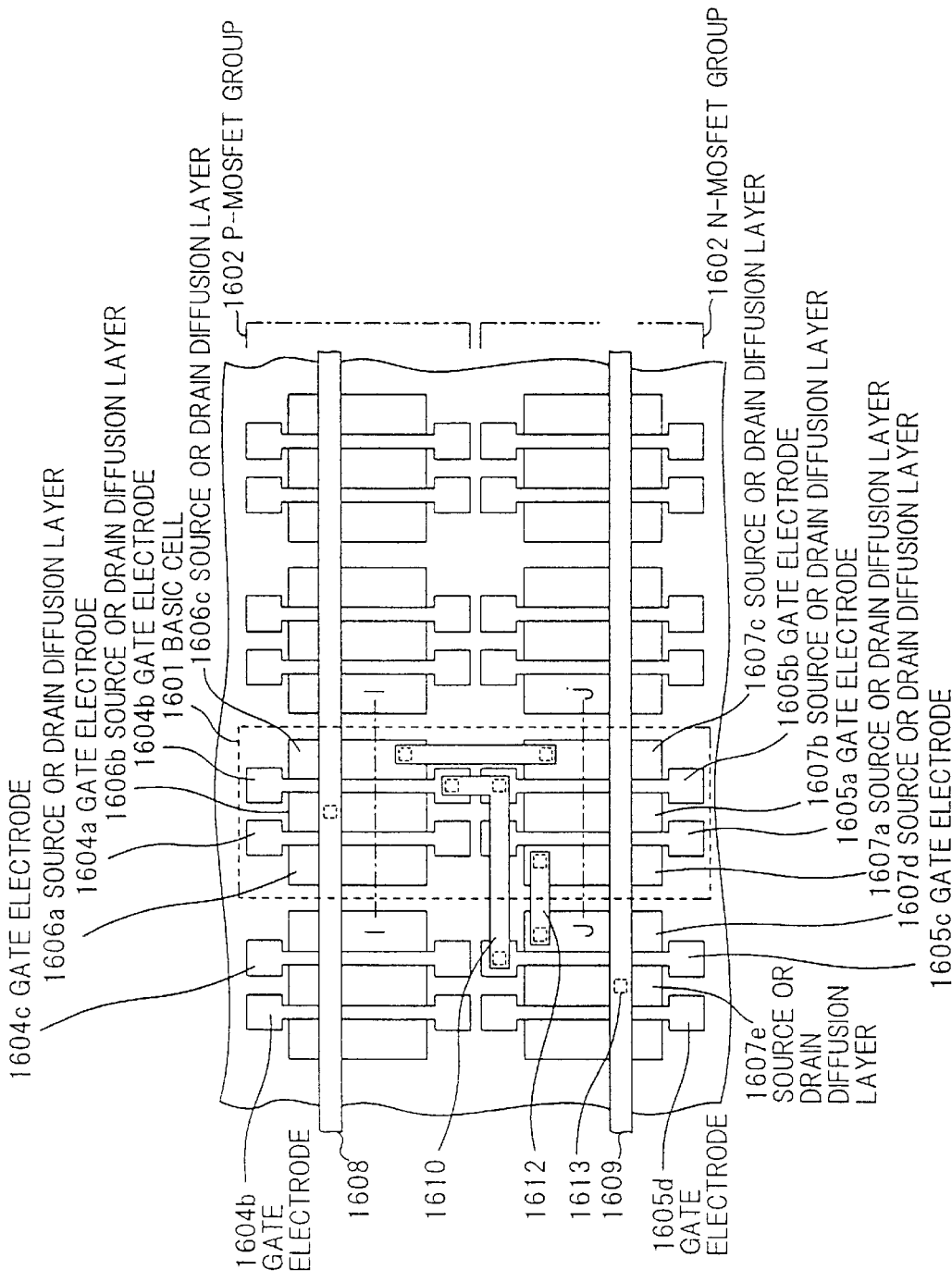
FIG. 5A is a layout diagram showing a conventional CMOS master-slice type semiconductor integrated circuit device formed on an SOI substrate.
Figure 5B:
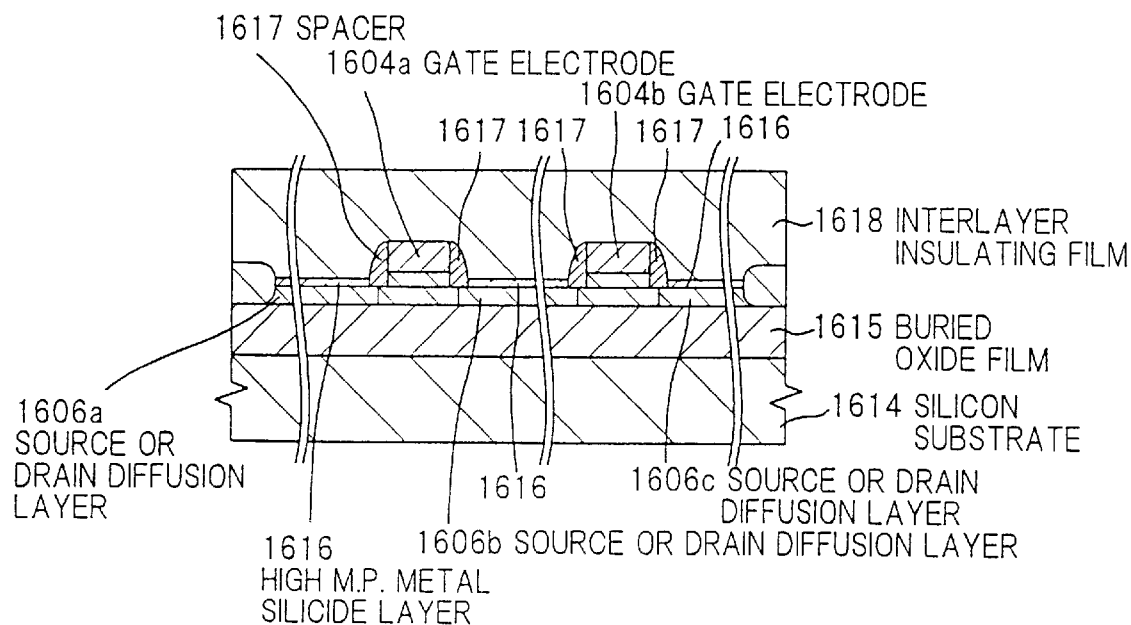
FIG. 5B is a cross sectional view cut along the line I—I in FIG. 5A.
Figure 5C:
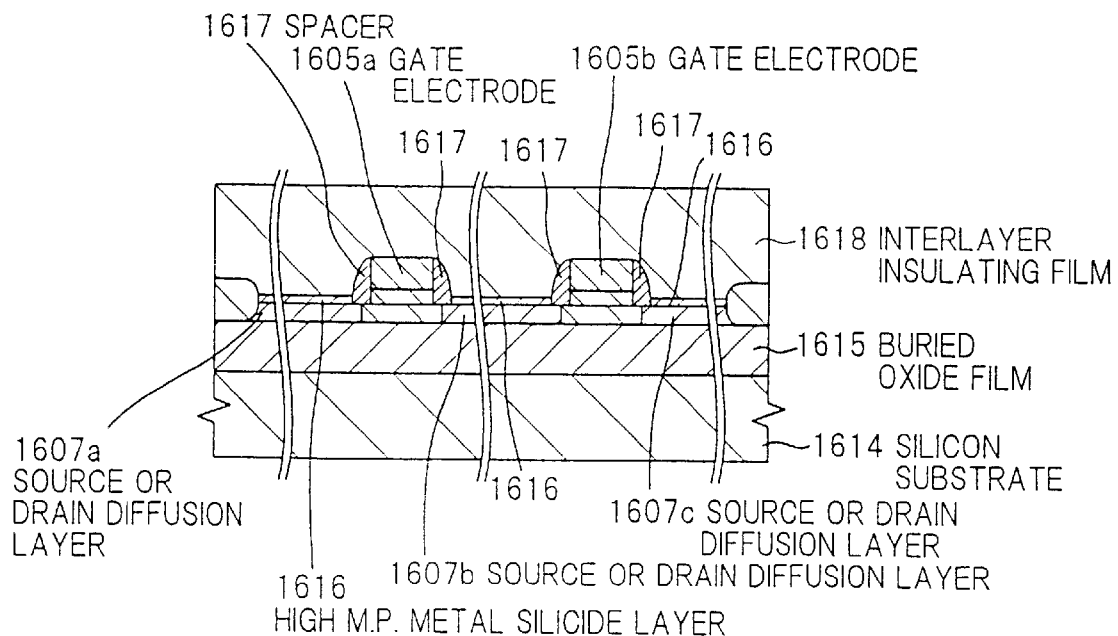
FIG. 5C is a cross sectional view cut along the line J—J in FIG. 5A.
Figure 16:
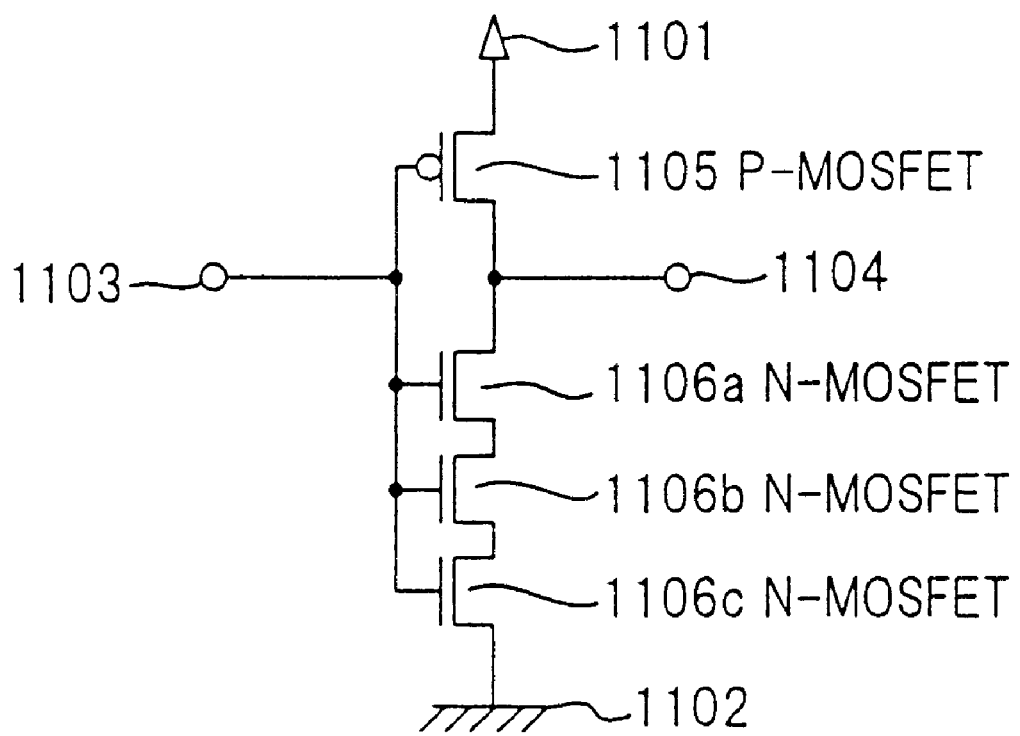
FIG. 16 is a circuit diagram showing a delay circuit.

Next, a conventional CMOS master-slice type semiconductor integrated circuit device formed on an SOI substrate will be explained in FIGS. 5A to 6C. FIG. 5A is a layout diagram showing the CMOS master-slice type semiconductor integrated circuit device. FIGS. 5B and 5C are enlarged cross sectional views cut along the lines I—I and J—J in FIG. 5A. Meanwhile, in FIG. 5A, an inverter circuit shown in FIG. 16 is laid out.

Referring to FIG. 5A, the CMOS master-slice type semiconductor integrated circuit device comprises an array of basic cells 1601, each of which is composed of two p-MOSFETs including gate electrodes 1604a, 1604b, source or drain diffusion layers 1606a to 1606c said two n-MOSFETs including gate electrodes 1605a, 1605b, source or drain diffusion layers 1607a to 1607c. In FIG. 5A, both a group of p-MOSFETs 1602 and a group of n-MOSFETs 1603 are laterally disposed. In general, the wiring process after forming a contact is called 'customizing process', where transistors, using the basic cell 1601 as one unit, are connected to compose a circuit in the wiring process.

A power source potential is supplied from a power source line 1608 through a contact hole 1613 to the source diffusion layer 1606b of p-MOSFET with the gate electrode 1604a. A ground potential is supplied from a ground line 1609 through a contact hole 1613 to the source diffusion layer 1607e of n-MOSFET with the gate electrode 1605c. Further, as shown in FIG. 5A, the source diffusion layer 1607a of n-MOSFET with the gate electrode 1605a is electrically connected through a signal line 1612 and contact holes 1613 to the drain diffusion layer 1607d of n-MOSFET with the gate electrode 1605c. Also, the drain diffusion layer 1606c of p-MOSFET with the gate electrode 1604b is electrically connected through an output signal line 1611 and contact holes 1613 to the drain diffusion layer 1607c of n-MOSFET with the gate electrode 1605b. The four gate electrodes 1604b, 1605a to 1605c are connected through an input signal line 1610 and contacts 1213. Based on the MOS transistors connection relationship, p-MOSFET with the gate electrode 1604b corresponds to p-MOSFET 1105 in FIG. 16, n-MOSFETs with the gate electrodes 1605b to 1605d correspond to n-MOSFETs 1106a to 1106c, respectively, in FIG. 16.

As shown in FIGS. 5B and 5C, the transistors in the basic cell 1601 are formed on buried oxide film 1615 on the silicon substrate 1614. Spacers 1617 are formed on both sides of each of the gate electrodes 1604a, 1605b. A high-melting-point metal silicide layer 1616 is formed on the surface of the source/drain diffusion layers 1606a, 1607a, etc. of p-MOSFET and n-MOSFET to reduce the layer resistance.

In the case shown in FIG. 5A, the basic cell 1601 is predetermined to be composed of two of p-MOSFETs and two of n-MOSFETs. Due to this, to compose the circuit in FIG. 16 that has one p-MOSFET and three n-MOSFETs, two regions of basic cells have to be used. In this case, of eight MOSFETs included in the two basic cells, four MOSFETs including three p-MOSFETs with the gate electrodes 1604a, c, d and one n-MOSFET with the gate electrode 1605d are left unused. These unused transistor regions cause a reduction in integration density of elements.

Figure 6A:
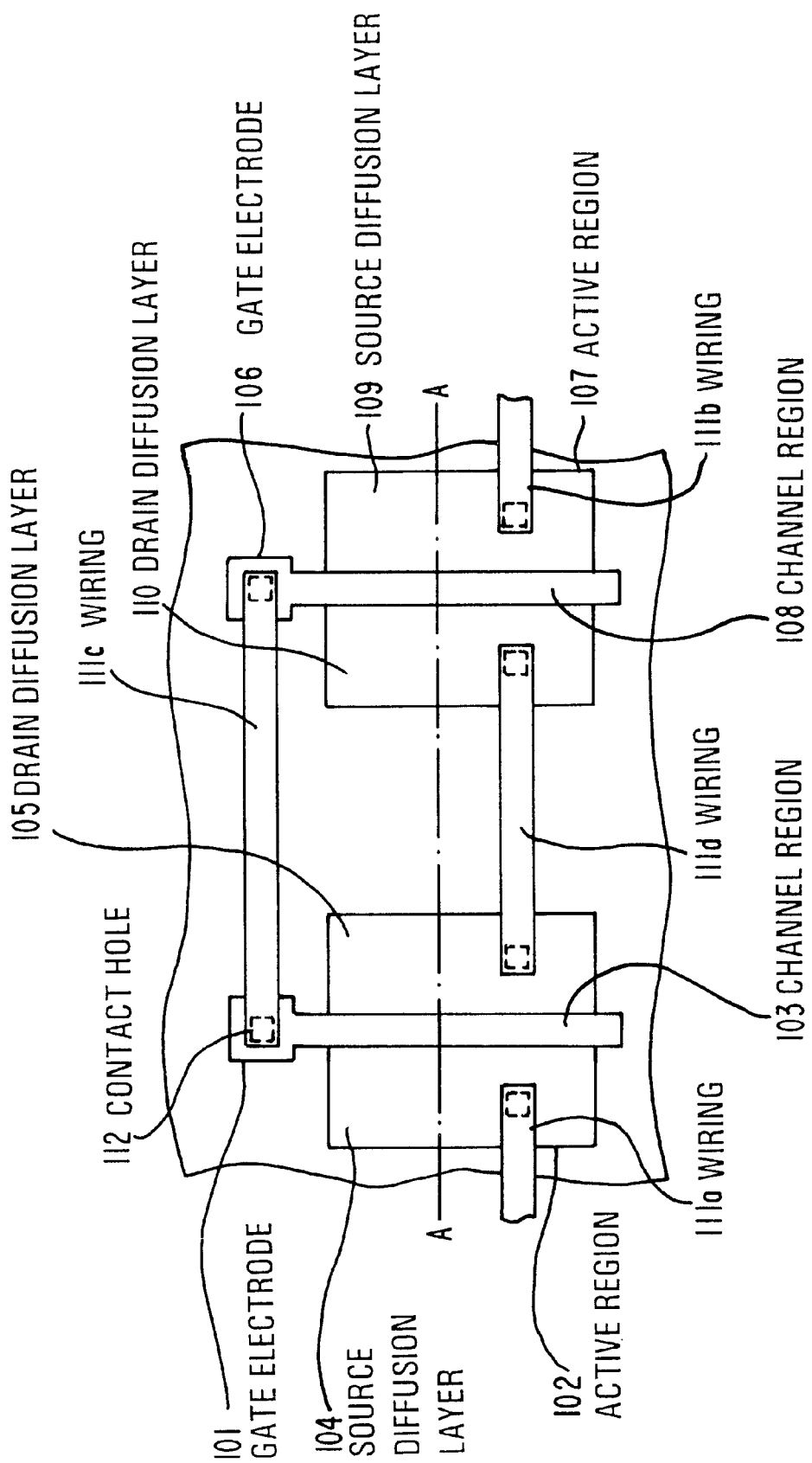
FIG. 6A is a layout diagram showing a CMOS semiconductor integrated circuit device in a first preferred embodiment according to the invention.
Figure 6B:
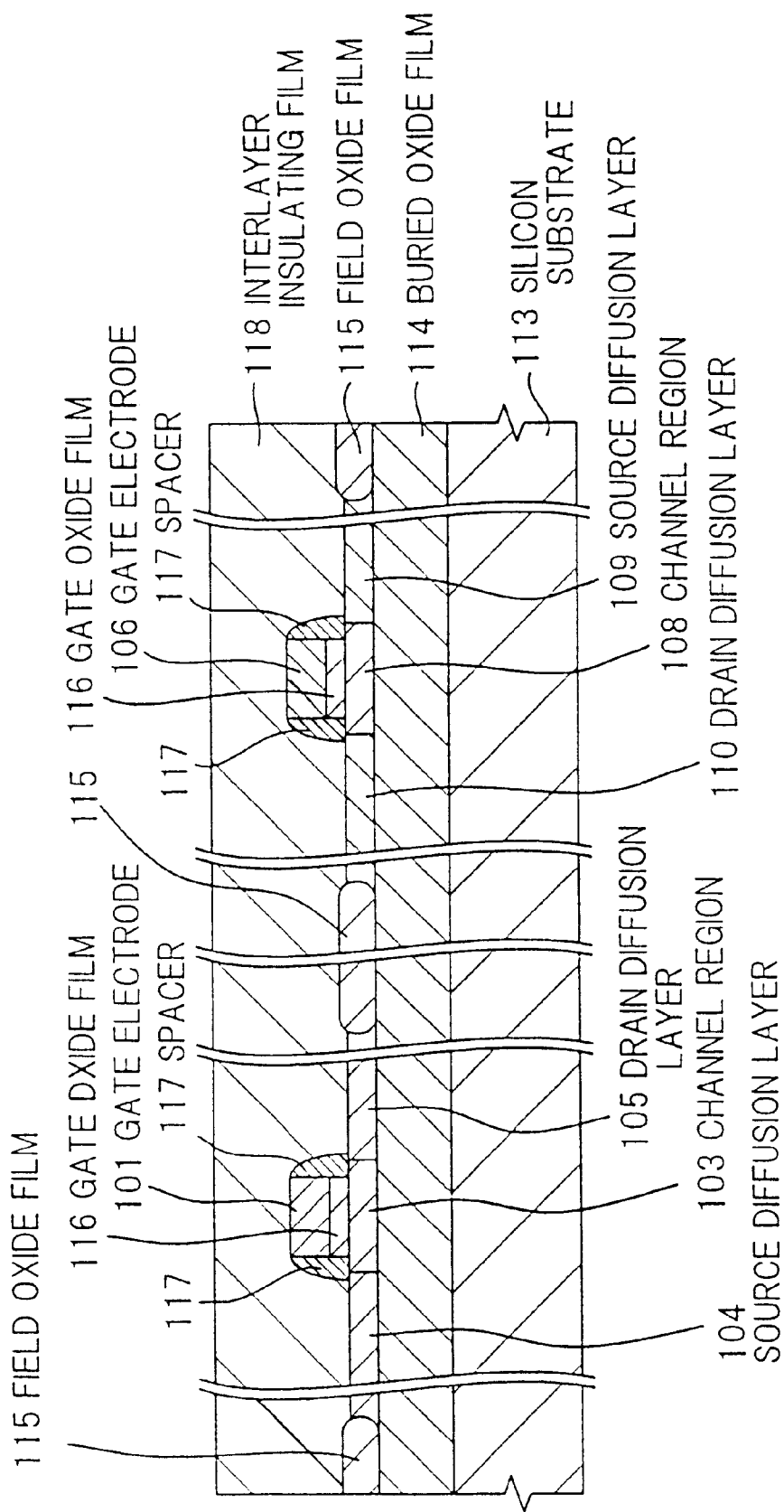
FIG. 6B is a cross sectional view cut along the line A—A in FIG. 6A, FIGS. 7A to 7E are cross sectional views showing a method of fabricating the device in FIGS. 6A and 6B.

Next, a method for making a semiconductor integrated circuit device in the first preferred embodiment will be explained in FIGS. 6A to 7E. FIG. 6A is a layout diagram showing an inverter circuit that p-MOSFET and n-MOSFET are formed on a common SOI substrate. FIG. 6B is an enlarged cross sectional view cut along the line A—A in FIG. 6A.

Referring to FIG. 6A, shown is a pattern composed of gate electrodes 101, 106, active regions 102, 107, wirings 111a to 111d, and contact holes 112. In the active region 102 of p-MOSFET, a channel region 103, a source diffusion layer 104 and a drain diffusion layer 105 are formed. Also, in the active region 107 of n-MOSFET, a channel region 108, a source diffusion layer 109 and a drain diffusion layer 110 are formed.

A power source potential is supplied from the wiring 111a through the contact hole 112 to the source diffusion layer 104 of p-MOSFET, and a ground potential is supplied from the wiring 111b through the contact hole 112 to the source diffusion layer 109 of n-MOSFET. Also, the gate electrode 101 of p-MOSFET is electrically connected through the wiring 111c and contact hole 112 to the gate electrode 106 of n-MOSFET. The drain diffusion layer 105 of p-MOSFET is electrically connected through the wiring 111d and contact hole 112 to the drain diffusion layer 110 of n-MOSFET. Thus, an inverter circuit shown in FIG. 8 is composed. A p-silicon substrate 113 and the source of n-MOSFET are grounded, and $V_{DD}$(positive) is applied to the source of p-MOSFET.

As shown in FIG. 6B, both p-MOSFET and n-MOSFET in FIG. 6A are formed on the SOI layer on buried oxide film 114 formed on the base, the silicon substrate 113. Gate oxide film 116 is formed under the gate electrodes 101, 106 of p-MOSFET and n-MOSFET, and spacers 117 are formed on both sides thereof. Also, field oxide films 115 are formed between the diffusion layers.

The difference from the conventional device in FIG. 3B is that the conductivity type of the channel region 103 of p-MOSFET in FIG. 6B is p-type whereas it is n-type in the conventional device.

Figure 7A:
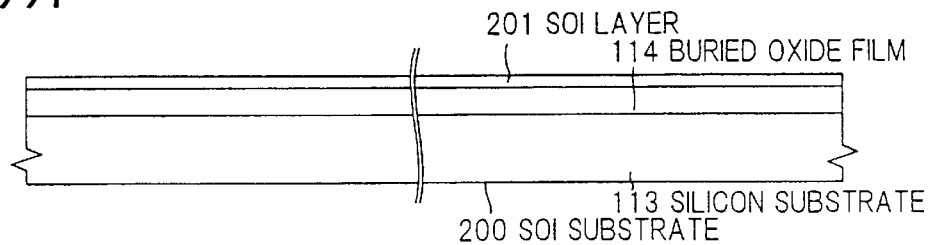
Figure 7B:
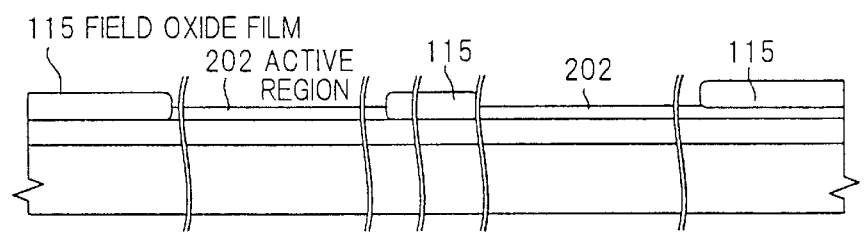

The process of fabricating the inverter circuit in the first embodiment will be explained in FIGS. 7A to 7E. The process is started using a SOI substrate 200 shown in FIG. 7A. The SOI substrate 200 is composed on the silicon substrate 113 as a base, the buried oxide film 114 formed on the silicon substrate 113, and an SOI layer 201 (silicon layer) formed on the buried oxide film 114. Then, like the conventional process described earlier, the SOI layer 201 is adjusted to have a desired thickness. Then, by forming a buffer layer (not shown) and then patterning of the buffer layer by using a first mask and then conducting the thermal oxidation, the field oxide film 115 is, as shown in FIG. 7B, formed. Thereby, the SOI layer 201 is sectioned into active regions 202 for MOSFET.

Figure 7C:
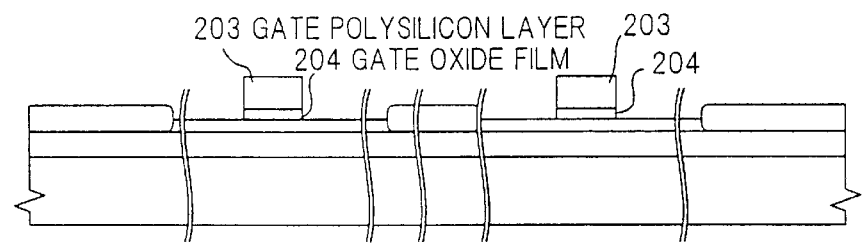
Figure 7D:
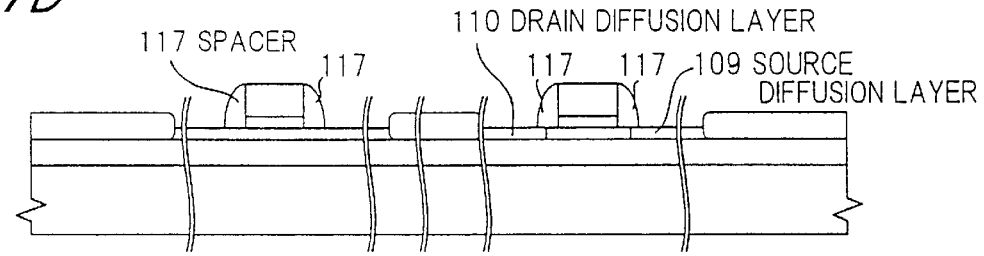

Then, the ion-implanting for adjusting Vt of MOSFET is conducted on the entire active region of the SOI layer. In FIG. 7B, an example that the conductivity type of the entire active region 202 is p-type is shown. After adjusting Vt, gate oxide film 204 and a gate polysilicon layer 203 are grown. Then, as shown in FIG. 7C, they are patterned to form gate electrodes by using a second mask. Then, as shown in FIG. 4D, the spacer 117 is formed on the sides of the gate electrode, and then, patterning photoresist by using a third mask and then ion-implanting selectively n-impurity, the n-type source/drain diffusion layers 109, 110 of n-MOSFET are formed. In this embodiment, at this ion-implanting, the conductivity type of MOSFET channel is determined.

Figure 7E:
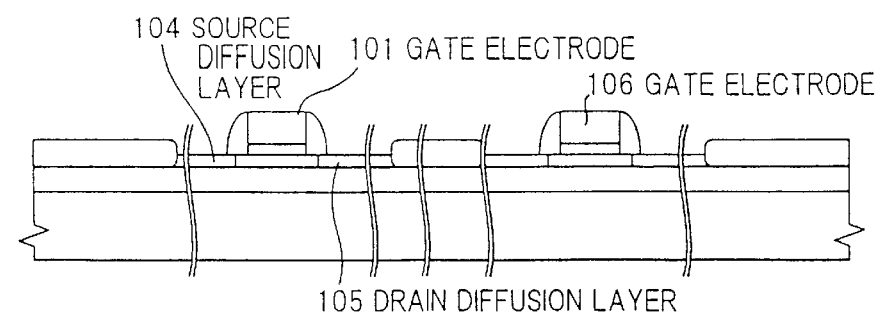

Then, by patterning photoresist by using a fourth mask and then ion-implanting selectively p-impurity, the p-type source/drain diffusion layers 104, 105 of p-MOSFET are formed as shown in FIG. 7E.

Also, by the ion-implanting to form the source/drain diffusion layers of MOSFET, the conductivity types of the gate electrode 101 of p-MOSFET and the gate electrode 106 of n-MOSFET are determined to be p-type and n-type, respectively.

Then, the wiring process follows. It is the same process as explained in the conventional SOI CMOS fabrication.

As described above, in the first embodiment, the mask patterns required from the start of the process until the formation of transistor before the wiring process can be reduced into four patterns for (1) field oxide film, (2) gate electrode, (3) n-source/drain diffusion layers, and (4) p-source/drain diffusion layers. Therefore, the manufacturing cost can be reduced comparing to that of conventional device.

A method for making a semiconductor integrated circuit device in the second preferred embodiment will be explained in FIGS. 9A to 10E. FIG. 6A is a layout diagram showing an inverter circuit that p-MOSFET and n-MOSFET are formed on a common SOI substrate. FIG. 7B is an enlarged cross sectional view cut along the line B—B in FIG. 6A.

In the second embodiment, the conductivity type of a gate electrode 101A of p-MOSFET is the same n-type as that of agate electrode 106A of n-MOSFET whereas it is p-type in the first embodiment. The other component and structure are the same as those in the first embodiment.

The process of fabricating the inverter circuit in the second embodiment will be explained in FIGS. 10A to 10E. The process is started using a SOI substrate 200 shown in FIG. 10A. In the second embodiment, the steps from the start to growing gate oxide film 204 and a gate polysilicon layer 203A in FIG. 10C are the same as those in the first embodiment.

Figure 10A:
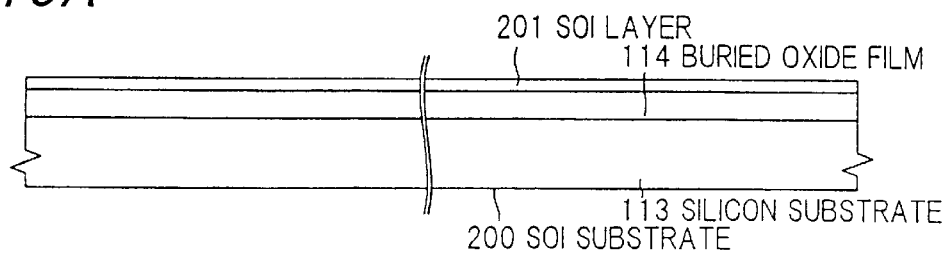
Figure 10B:
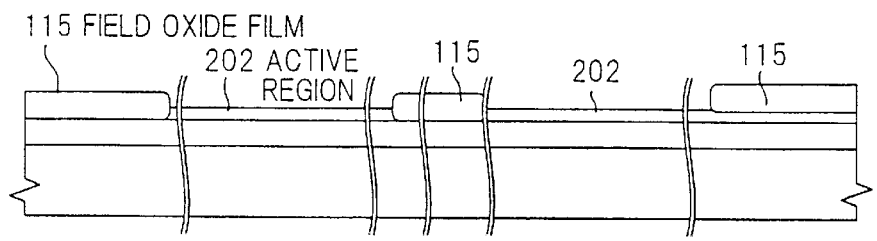
Figure 10C:
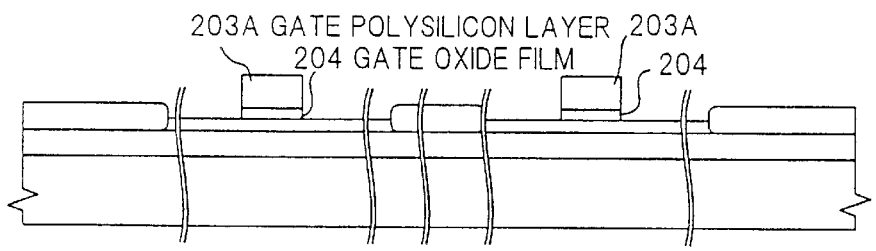

In the second embodiment, after processing the conductivity type of the gate polysilicon layer of 300 nm thick into n-type (with a phosphorus concentration of about $10^{22} cm^{-3}$), the gate electrodes are patterned by using a second mask as shown in FIG. 10C.

Figure 10D:
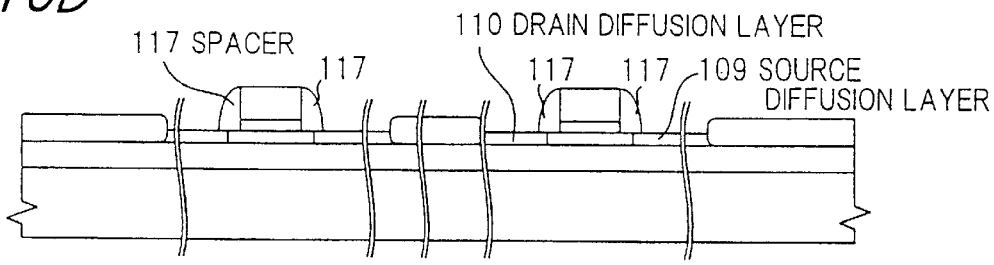

Then, as shown in FIG. 10D, the spacer 117 is formed on the sides of the gate electrode 203A, and then, by ion-implanting selectively n-impurity (e.g., arsenic), the entire region to be source/drain diffusion layers of MOSFET is self-matchingly formed into n-type. At this time, the source/drain diffusion layers 109, 110 of n-MOSFET are determined.

Figure 10E:
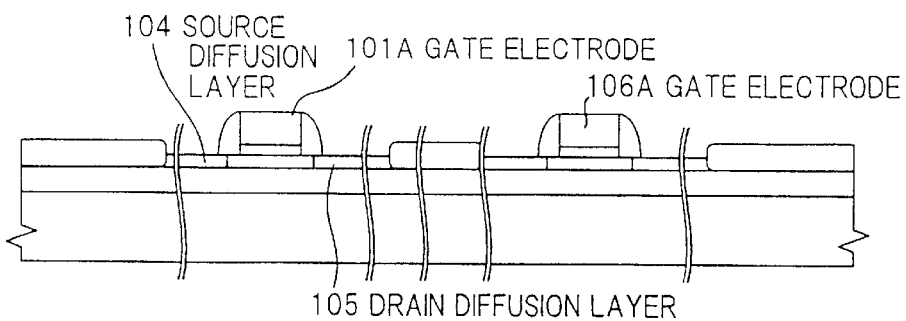

Then, by patterning photoresist by using a third mask and then ion-implanting selectively p-impurity ($BF_2^+$, $10^{18} cm^{-2}$), the p-type source/drain diffusion layers 104, 105 of p-MOSFET are formed as shown in FIG. 10E. At this time, the conductivity type of MOSFET channel is determined.

Then, the wiring process follows. It is the same process as explained in the conventional SOI CMOS fabrication.

As described above, in the second embodiment, the mask patterns required from the start of the process until the formation of transistor before the wiring process can be reduced into three patterns for (1) field oxide film, (2) gate electrode, and (3) p-source/drain diffusion layers. Therefore, the manufacturing cost can be further reduced comparing to that of conventional device.

Meanwhile, p-MOSFET in the first embodiment is generally of depletion type because the conductivity type of the gate electrode 101 is p-type and the channel region 103 is p-type due to the impurity concentration to be set according to the Vt value of n-MOSFET. However, in the second embodiment, p-MOSFET can be advantageously of enhancement type because the conductivity type of the gate electrode 101 of p-MOSFET is made to be n-type.

For example, C. Raynaud et al., Proceedings 1995 IEEE International SOI Conference, August, 1995, pp.12–13 reports p-MOSFET of enhancement type, with buried oxide film of 400 nm thick, SOI layer of 40 nm thick, gate oxide film of a 4.5 nm thick, gate length of 0.2 μm and threshold voltage of –0.44V. Also in this embodiment, p-MOSFET of enhancement type is obtained along the above conditions.

Figure 11A:
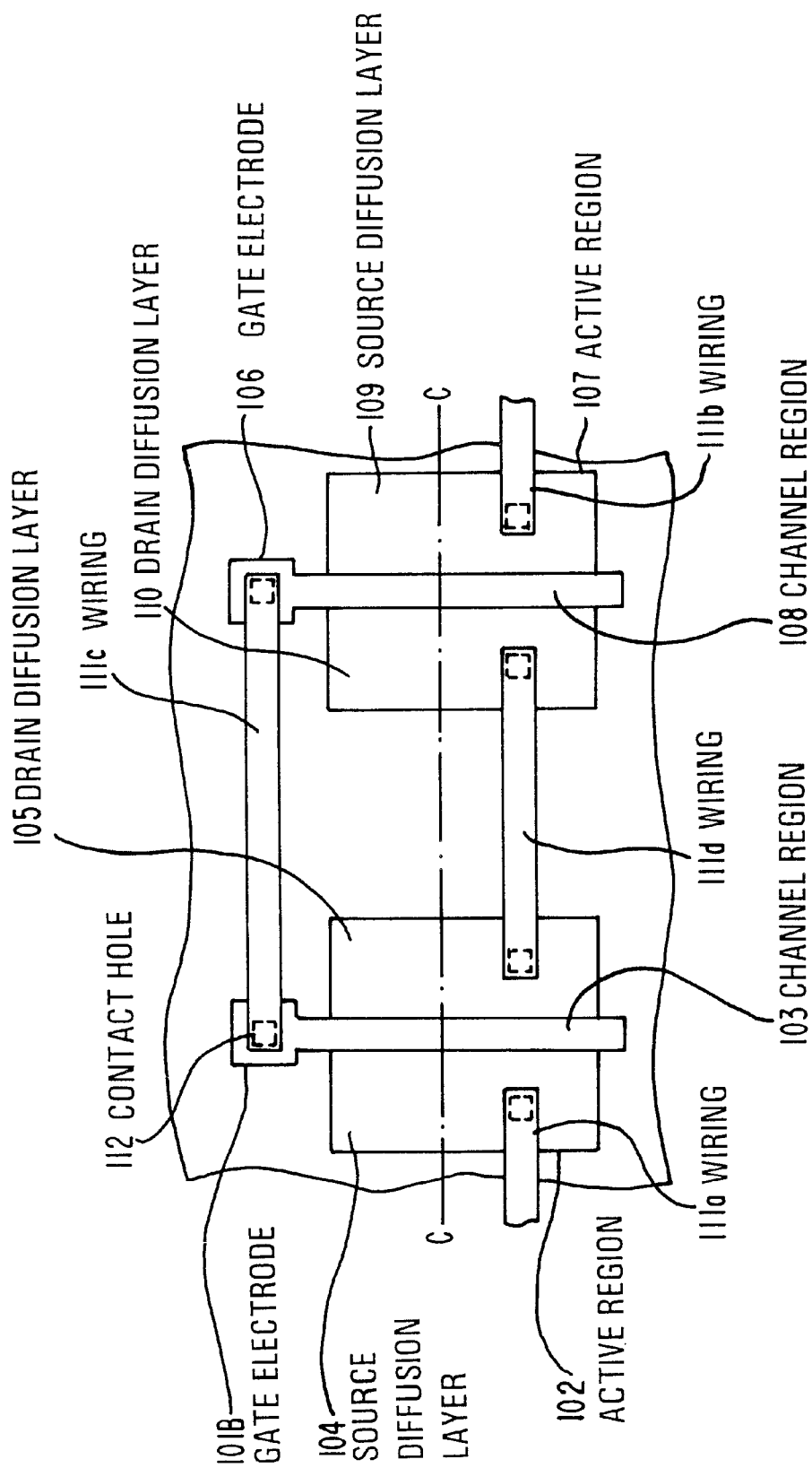
FIG. 11A is a layout diagram showing a CMOS semiconductor integrated circuit device in a third preferred embodiment according to the invention.

A method for making a semiconductor integrated circuit device in the third preferred embodiment will be explained in FIGS. 11A to 12E. FIG. 11A is a layout diagram showing an inverter circuit that p-MOSFET and n-MOSFET are formed on a common SOI substrate. FIG. 11B is an enlarged cross sectional view cut along the line C—C in FIG. 11A.

In the third embodiment, the conductivity type of a channel region 103A of p-MOSFET is n-type whereas it is p-type in the first embodiment.

The process of fabricating the inverter circuit in the third embodiment will be explained in FIGS. 12A to 12E. The process is started using a SOI substrate 200 shown in FIG. 12A. In the third embodiment, the steps from the start until patterning gate electrodes by using a second mask in FIG. 12C and forming spacers 117 on both sides of the gate electrode are the same as those in the first embodiment.

Figure 12A:
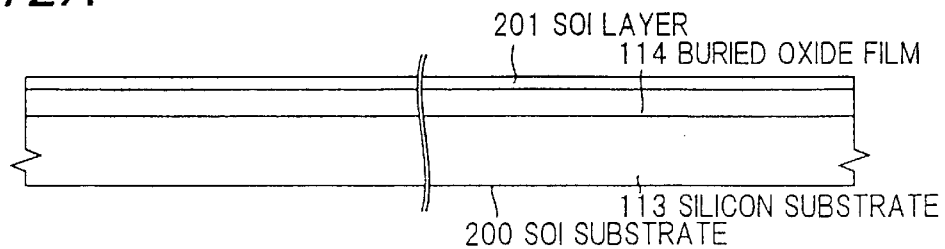
Figure 12B:
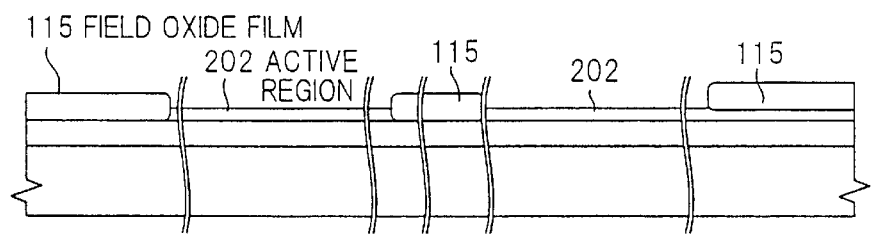
Figure 12C:
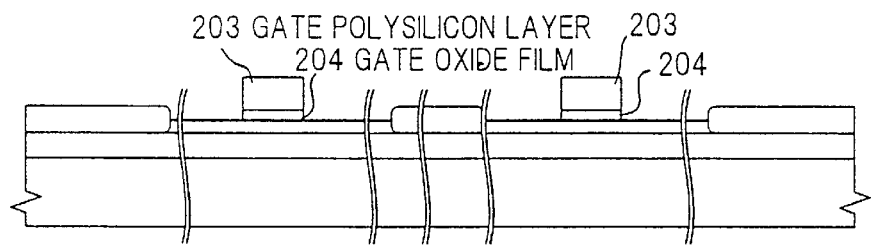
Figure 12D:
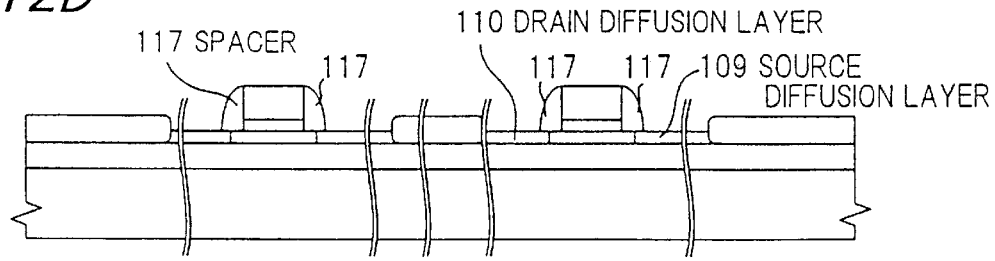

In the third embodiment, by ion-implanting selectively n-impurity on the entire surface like the second embodiment, the entire region to be source/drain diffusion layers of MOSFET is self-matchingly formed into n-type as shown in FIG. 12D. At this time, the n-type source/drain diffusion layers 109, 110 of n-MOSFET are determined.

Figure 12E:
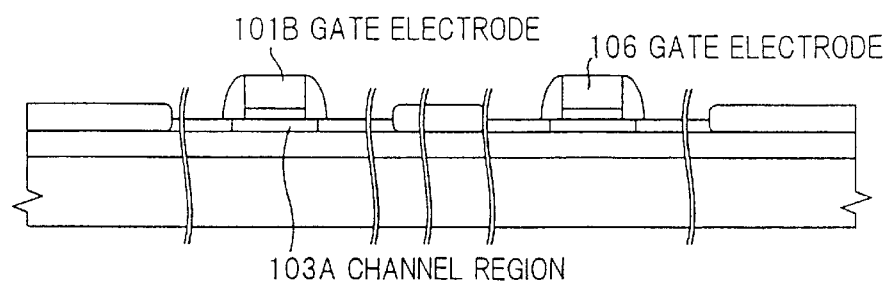

Then, by patterning photoresist by using a third mask and then ion-implanting selectively p-impurity, the p-type source/drain diffusion layers 104, 105 of p-MOSFET are formed as shown in FIG. 12E. In this embodiment, the conductivity type of MOSFET channel is determined at this tie.

Further, by patterning photoresist by using a fourth mask and then ion-implanting selectivity n-impurity with an energy to penetrate through the gate polysilicon layer 203 and gate oxide film 204, the conductivity type of the channel region 103A of p-MOSFET is made to be n-type.

Then, the wiring process follows. It is the same process as explained in the conventional SOI CMOS fabrication.

As described above, in the third embodiment, the mask patterns required from the start of the process until the formation of transistor before the wiring process can be reduced into four patterns for (1) field oxide film, (2) gate electrode, (3) p-source/drain diffusion layers and (4) channel implantation for p-MOSFET. Therefore, the manufacturing cost can be reduced comparing to that of conventional device.

Meanwhile, p-MOSFET in the first embodiment is generally of depletion type because the conductivity type of the gate electrode 101 is p-type and the channel region 103 is p-type due to the impurity concentration to be set according to the Vt value of n-MOSFET. However, in the third embodiment, p-MOSFET can be advantageously of enhancement type because the conductivity type of the channel region 103A of p-MOSFET is made to be n-type.

Figure 13A:
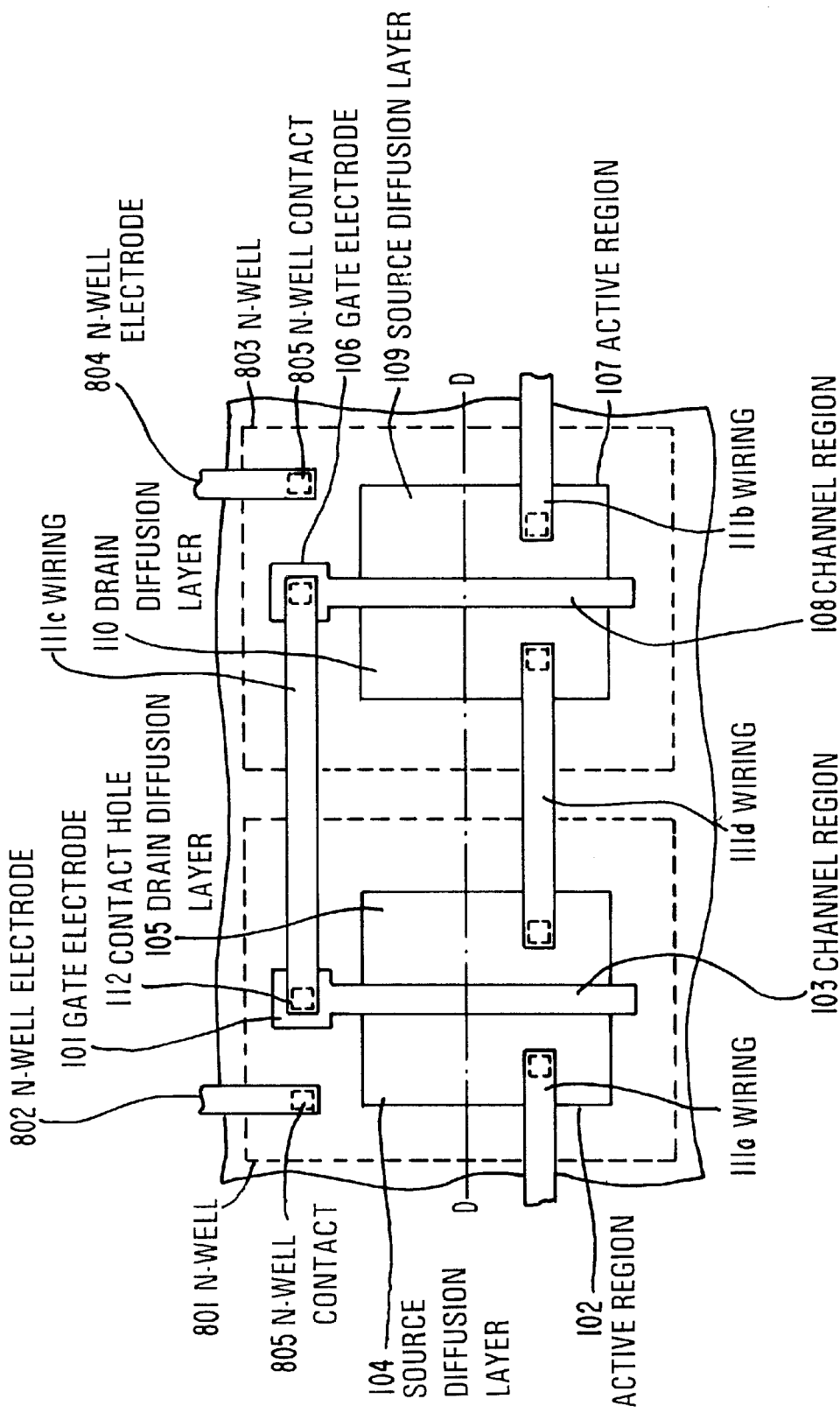
FIG. 13A is a layout diagram showing a CMOS semiconductor integrated circuit device in a fourth preferred embodiment according to the invention.

A method for making a semiconductor integrated circuit device in the fourth preferred embodiment will be explained in FIGS. 13A to 14E. FIG. 13A is a layout diagram showing an inverter circuit that p-MOSFET and n-MOSFET are formed on a common SOI substrate. FIG. 13B is an enlarged cross sectional view cut along the line D—D in FIG. 13A.

In the fourth embodiment, as shown in FIG. 13A, n-wells 801, 803, n-well electrodes 802, 804 and n-well contacts 805 are added to FIG. 6A. Also, the difference between FIG. 13B and FIG. 6B is that the n-wells 801, 803 (to be applied of a voltage higher than a ground potential) are formed under buried oxide film 114 and below p-MOSFET and n-MOSFET.

Figure 14A:
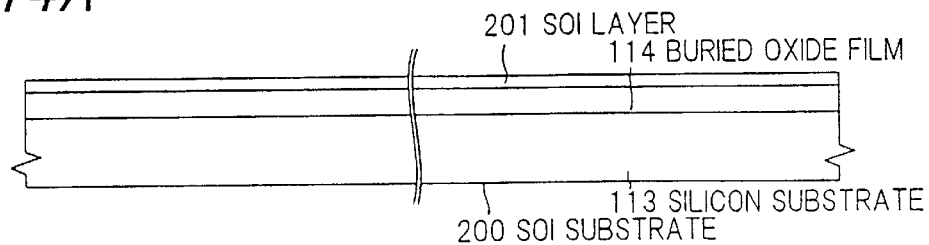
Figure 14B:
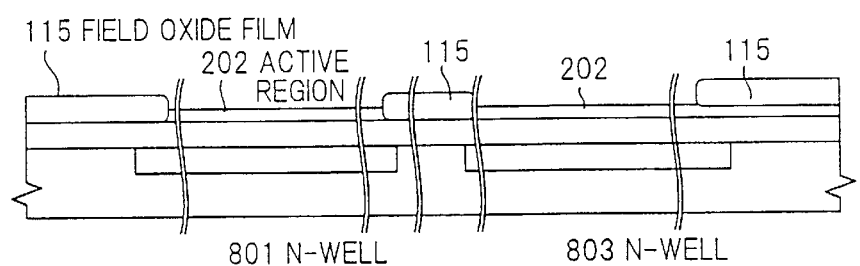
Figure 14C:
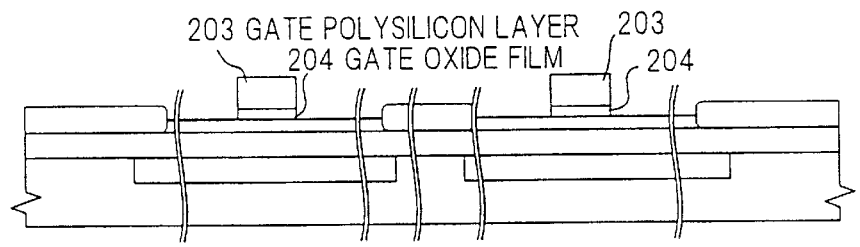
Figure 14D:
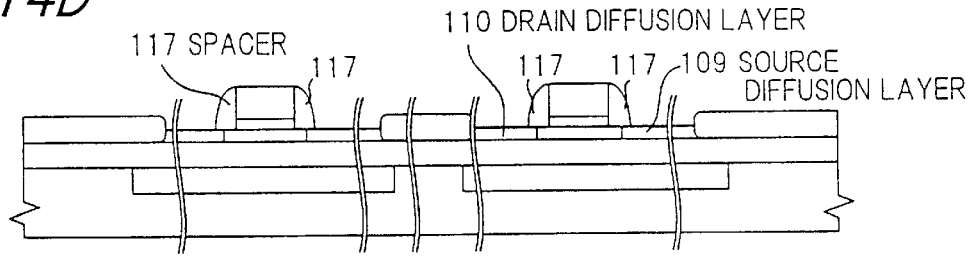
Figure 14E:
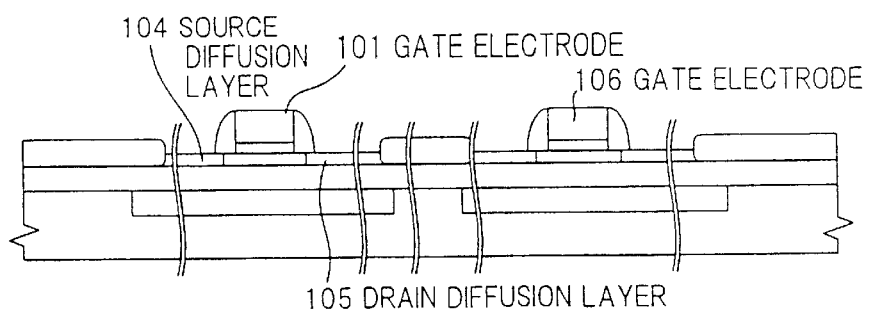

The process of fabricating the inverter circuit in the fourth embodiment will be explained in FIGS. 14A to 14E. The process is started using a SOI substrate 200 shown in FIG. 14A. Then, by adjusting the SOI layer 201 to have a desired thickness, forming a buffer layer (not shown) and then patterning of the buffer layer by using a first mask and then conducting the thermal oxidation, the field oxide film 115 is, as shown in FIG. 14B, formed. Thereby, the SOI layer 201 is sectioned into active regions 202 for MOSFET.

Then, the ion-implanting for adjusting Vt of MOSFET is conducted on the entire active region of the SOI layer. In FIG. 14B, a example that the conductivity type of the entire active region 202 is p-type is shown. After adjusting Vt, by patterning photoresist by using a second mask and then ion-implanting selectively n-impurity under the buried oxide film 114, the n-wells 801, 803 are formed.

Thereafter, the steps of patterning gates by using a third mask, forming spacers 117, once forming the region to be source/drain diffusion layers of MOSFET into n-type, then patterning photoresist by using a fourth mask, ion-implanting selectively p-impurity thereby forming the p-type source/drain diffusion layers 104, 105 of p-MOSFET are the same as those in the third embodiment.

Then, in the wiring step, a step of forming the well contacts 805 is added.

As described above, in the fourth embodiment, the mask patterns required from the start of the process until the formation of transistor before the wiring process can be reduced into four patterns for (1) field oxide film, (2) n-well, (3) gate electrode, and (4) p-source/drain diffusion layers.

In the fourth embodiment, the n-wells formed under MOSFET is used as a back gate whose potential can be controlled through the n-well electrodes 802, 804 to control the Vt value of MOSFET.

Though, in this embodiment, an example that the n-well is added to the third embodiment is shown, such an n-well can be also added to the first or second embodiment.

Figure 15A:
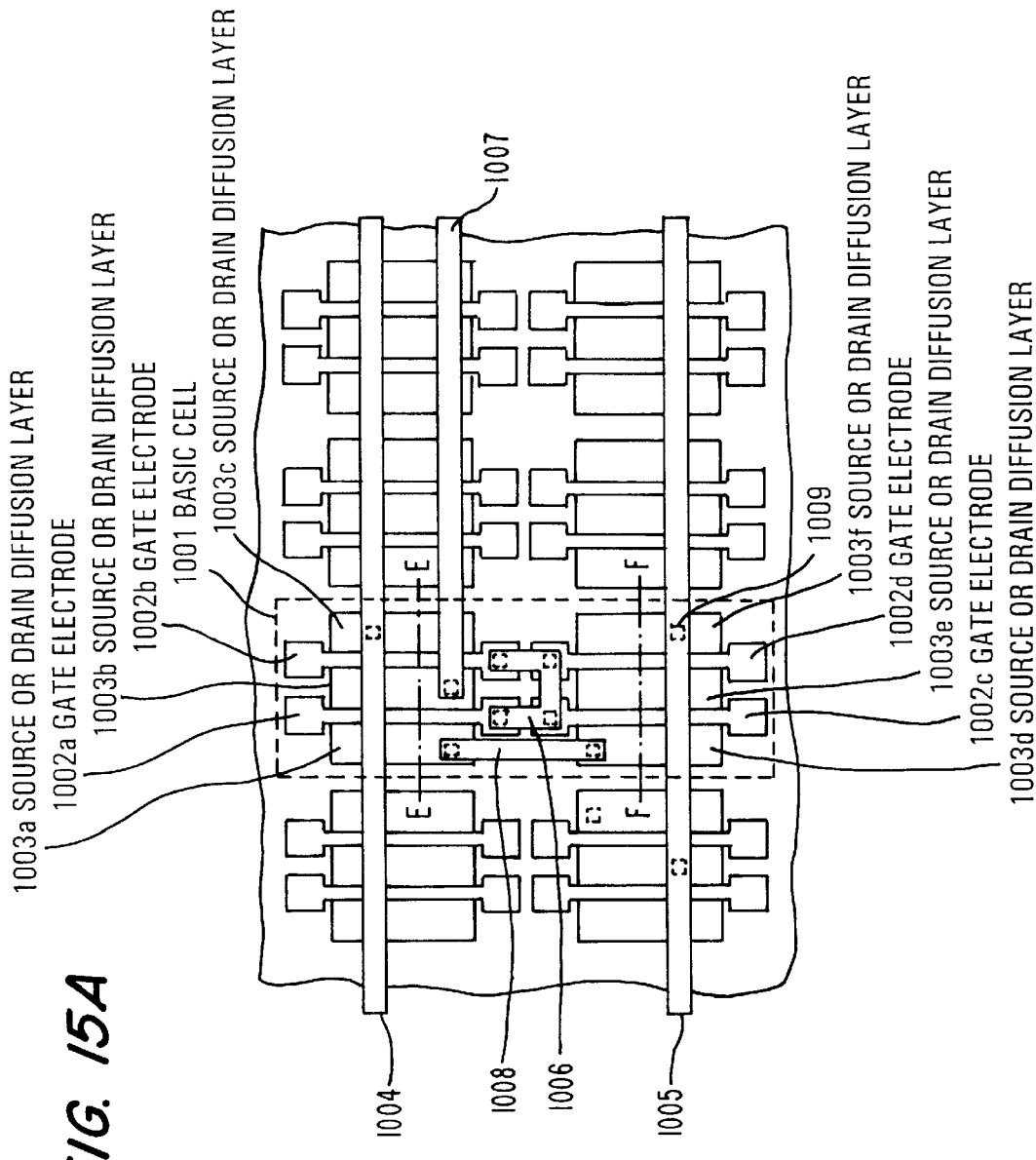
FIG. 15A is a layout diagram showing a CMOS master-slice type semiconductor integrated circuit device in a fifth preferred embodiment according to the invention.
Figure 15B:
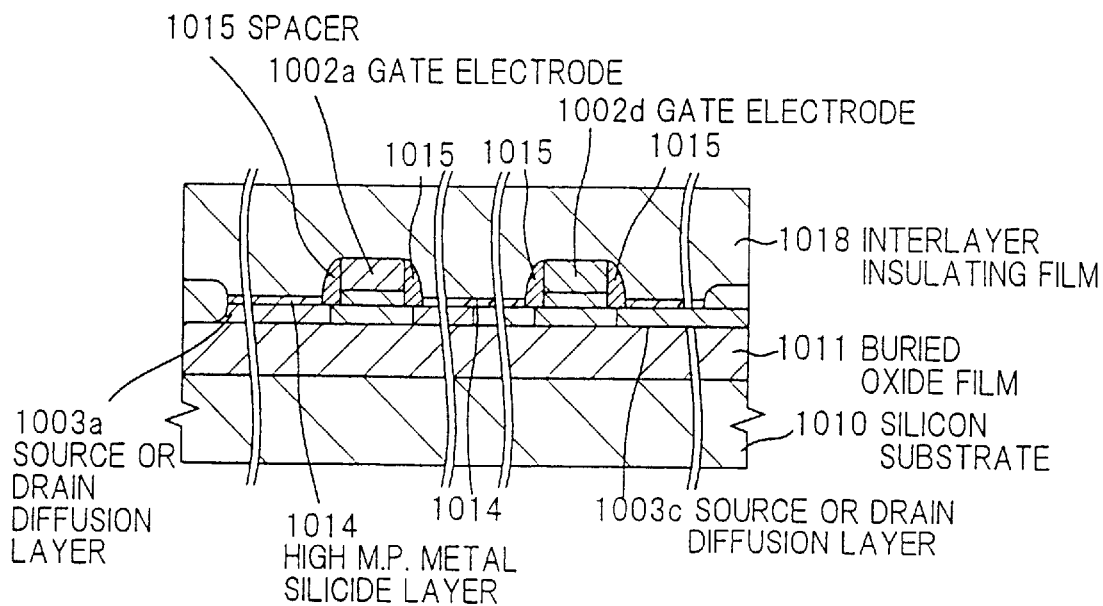
FIG. 15B is a cross sectional view cut along the line E—E in FIG. 15A.
Figure 15C:
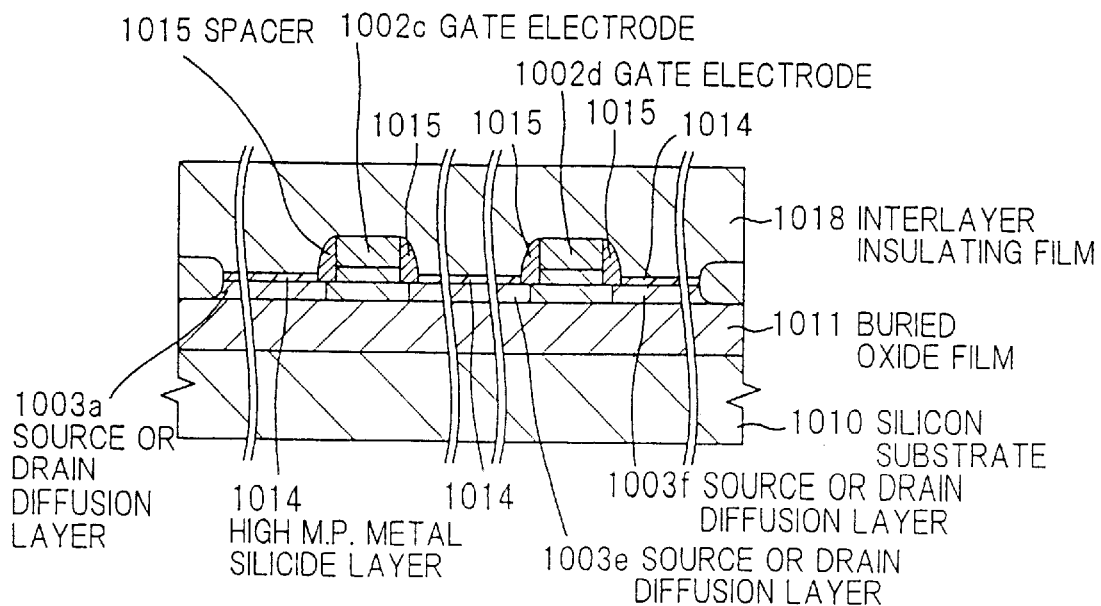
FIG. 15C is a cross sectional view cut along the line F—F in FIG. 15A.

A CMOS master-slice type semiconductor integrated circuit device and a method for making the same in the fifth preferred embodiment will be explained in FIGS. 15A to 15C. FIG. 15A is a layout diagram showing the CMOS master-slice type semiconductor integrated circuit device formed on a SOI substrate. FIGS. 15B and 15C are enlarged cross sectional views cut along the lines E—E and F—F, respectively, in FIG. 15A. Meanwhile, in FIG. 15A, an inverter circuit shown in FIG. 16 is laid out.

Referring to FIG. 15A, the CMOS master-slice type semiconductor integrated circuit device comprises an array of basic cells 1001, each of which is composed of four MOSFETs with gate electrodes 1002a to 1002d, source or drain diffusion layers 1006a to 1006d.

In this embodiment, prepared is a master substrate like that in FIG. 10D that the entire region to be source/drain diffusion layers of MOSFET in the master-slice region is formed into n-type.

Namely, by forming field oxide film, the SOI layer is sectioned into several active regions. All the active regions are designed to have same dimensions and are disposed in two parallel rows. The two rows compose the basic cell sequences of CMOS gate array. Then, after forming gate oxide film, growing a gate polysilicon layer and doping into n-type, it is patterned. Here, two parallel gate electrodes are formed for each active layer. Then, spacers are formed, and then ion-implantation is conducted to form the entire region to be source/drain diffusion layers of MOSFET into n-type.

Then, to this master substrate (base substrate), the customizing process that includes the steps from the ion-implanting process for forming p-MOSFET diffusion layers to the wiring process can be conducted, thereby fabricating the master-slice type semiconductor integrated circuit device. Namely, the arrangement of p-MOSFET can be optionally determined according to a circuit desired by customers.

Referring to FIG. 15A, a power source potential is supplied from a power source line 1004 through a contact hole 1009 to a p-type source diffusion layer 1003c of p-MOSFET diffusion layers to the wiring process can be conducted, thereby fabricating the master-slice type semiconductor integrated circuit device. Namely, the arrangement of p-MOSFET can be optionally determined according to a circuit desired by customers.

Referring to FIG. 15A, a power source potential is supplied from a power source line 1004 through a contact hole 1009 to a p-type source diffusion layer 1003c of p-MOSFET with the gate electrode 1002b. A ground potential is supplied from a ground line 1005 through a contact hole 1009 to a n-type source diffusion layer 1003f of n-MOSFET with the gate electrode 1002d. Further, a n-type source diffusion layer 1003a of n-MOSFET with the gate electrode 1002a is electrically connected through a signal line 1008 and contact holes 1009 to a n-type drain diffusion layer 1003d of n-MOSFET with the gate electrode 1002c. Also, in this embodiment, a p-type drain diffusion layer 1013 of p-MOSFET with the gate electrode 1002b and a n-type drain diffusion layer 1012 of n-MOSFET with the gate electrode 1002a are formed in a common diffusion-layer-forming region 1003b, and they are electrically connected through a high-melting-point metal silicide layer 1014 to each other. This potential is taken out through a contact hole 1009 to an output signal line 1007. Also, the four gate electrodes 1002a to 1002d are connected through an input signal line 1006 (connecting with an input signal line of a second layer (not shown)) and contact holes 1009.

Based on the MOS transistors connection relation, p-MOSFET with the gate electrode 1002b corresponds to p-MOSFET 1105 in FIG. 16, n-MOSFETs with the gate electrodes 1002a,c,d correspond to n-MOSFETs 1106a to 1106c, respectively, in FIG. 16. Thus, in this embodiment, the circuit composed of two cells in the conventional device in FIG. 5A can be composed of one cell.

In this embodiment, an example as to one basic cell 1001 is shown. Part of the other basic cells can be composed of a desired number of same cells and the remainder can be formed like the conventional basic cell 1601 shown in FIG. 5A. Optionally, a suitable number of basic cells that all the active regions are of n-MOSFET can be also formed. The number and arrangement of p-MOSFET and n-MOSFET in basic cell can be optionally determined according to a circuit required.

As described above, in the master-slice semiconductor integrated circuit device in this embodiment, the number and arrangement of p-MOSFET and n-MOSFET in basic cell can be optionally determined in the customizing process. Therefore, the number of unused transistors in the conventional device shown in FIG. 5A can be decreased, thereby enhancing the integration density of elements.

Though an example that all the active regions are designed to have same dimensions is shown, different kinds of active regions that are designed to have different dimensions may be formed. In this case, the dimensions of MOSFET can be also varied according to the dimensions of the active region. Though an example that two gate electrodes are formed for an active region is shown, the number of gate electrodes is not limited to this. For example, three gate electrodes may be formed.

In the fourth embodiment, the master-slice type semiconductor integrated circuit device is obtained by using the structure and fabrication method of MOSFET in the first embodiment. However, it may be obtained by using the structure and fabrication method of MOSFET in the first, second or third embodiment.

Meanwhile, in the above embodiments, the products are of enhancement type unless specified as depletion type.

Also, in the cross sectional views showing the respective fabrication process, to figure some slope is omitted.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for making a semiconductor integrated circuit device having a p-channel MOS field-effect transistor and a n-channel MOS field-effect transistor on a common SOI substrate comprised of a first silicon layer, an insulating film and a second silicon layer, the method comprising:

forming insulation regions to divide the second silicon layer of the SOI substrate into a plurality of active regions;

forming gate insulating layers of said p-channel and n-channel transistors;

forming gate electrodes of said p-channel and n-channel transistors; and subsequent to forming said gate electrodes, implanting impurities into active regions of said p-channel and n-channel transistors to set the conductivity types of the p-channel and n-channel transistors.

2. A method for making a semiconductor integrated circuit device, according to claim 1, wherein:

said gate electrodes are formed after forming wells with a high impurity concentration in said first silicon layer under the active regions of said p-channel and n-channel transistors.

3. A method for making a semiconductor integrated circuit device, according to claim 2, wherein:

after forming said gate electrodes, a second conductivity type of source region and a second conductivity type of drain region are formed in the active region on both sides of selected one of said gate electrodes and a first conductivity type of source region and a first conductivity type of drain region are formed in the active region on both sides of the other of said gate electrodes.

4. A method for making a semiconductor integrated circuit device, according to claim 2, wherein:

after forming said gate electrodes, a second conductivity type of source region and a second conductivity type of drain region are formed in the entire active region, and then the second conductivity type of source region and the second conductivity type of drain region formed in the active region on both sides of selected one of said gate electrodes are converted into a first conductivity type of source region and a first conductivity type of drain region, respectively.

5. A method for making a semiconductor integrated circuit device, according to claim 4, wherein:

said gate electrode is formed as second conductivity type of silicon film on the gate insulating film, and said converting step from the second conductivity type of source region and the second conductivity type of drain region to the first conductivity type of source region and the first conductivity type of drain region, respectively is conducted under such conditions that the conductivity type of said second conductivity type of silicon film is not changed.

6. A method for making a semiconductor integrated circuit device, according to claim 2, wherein:

the impurity concentration of a channel region is adjusted by implanting second conductivity type of impurity into the SOI layer located between a first conductivity type of source region and a first conductivity type of drain region.

7. A method for making a semiconductor integrated circuit device according to claim 1, wherein:

after forming said gate electrodes, a second conductivity type of source region and a second conductivity type of drain region are formed in the active region on both sides of selected one of said gate electrodes and a first conductivity type of source region and a first conductivity type of drain region are formed in the active region on both sides of the other of said gate electrodes.

8. A method for making a semiconductor integrated circuit device, according to claim 1, wherein:

after forming said gate electrodes, a second conductivity type of source region and a second conductivity type of drain region are formed in the entire active region, and then the second conductivity type of source region and the second conductivity type of drain region formed in the active region on both sides of selected one of said gate electrodes are converted into a first conductivity type of source region and a first conductivity type of drain region, respectively.

9. A method for making a semiconductor integrated circuit device, according to claim 8, wherein:

said gate electrode is formed as second conductivity type of silicon film on the gate insulating film, and said converting step from the second conductivity type of source region and the second conductivity type of drain region to the first conductivity type of source region and the first conductivity type of drain region, respectively is conducted under such conditions that the conductivity type of said second conductivity type of silicon film is not changed.

10. A method for making a semiconductor integrated circuit device, according to claim 9, wherein:

the impurity concentration of a channel region is adjusted by implanting second conductivity type of impurity into the SOI layer located between a first conductivity type of source region and a first conductivity type of drain region.

11. A method for making a semiconductor integrated circuit device, according to claim 8, wherein:

the impurity concentration of a channel region is adjusted by implanting second conductivity type of impurity into the SOI layer located between a first conductivity type of source region and a first conductivity type of drain region.

12. A method for making a semiconductor integrated circuit device, according to claim 1, wherein:

the impurity concentration of a channel region is adjusted by implanting second conductivity type of impurity into the SOI layer located between a first conductivity type of source region and a first conductivity type of drain region.

13. A method for making a master-slice type semiconductor integrated circuit device, the method comprising preparing a master substrate by:

forming insulation regions on a silicon layer of an SOI substrate to divide the silicon layer into a plurality of pairs of active regions;

forming gate insulating layers of transistors in each of said active regions;

forming gate electrodes in each of said active regions; and subsequent to forming said gate electrodes, customizing said master substrate according to a circuit desired by customers by implanting impurities into said active regions to set desired conductivity types of MOS field-effect transistors, wherein said customizing step is conducted by disposing one of a p-channel MOS field-effect transistor and an n-channel MOS field-effect transistor in each active region of a pair of active regions to form basic cells having different combinations of p-channel MOS field-effect transistors and n-channel MOS field-effect transistors, and providing wiring to a selected one of said basic cells.

14. A method for making a master-slice type semiconductor integrated circuit device, according to claim 13, wherein:

said gate electrodes are formed after forming wells having high impurity concentrations under the active regions in a second silicon layer separated from said silicon layer by an insulating layer.

15. A method for making a master-slice type semiconductor integrated circuit device, according to claim 14, wherein:

after forming said gate electrodes, a second conductivity type of source region and a second conductivity type of drain region are formed in the active region on both sides of selected one of said gate electrodes and a first conductivity type of source region and a first conductivity type of drain region are formed in the active region on both sides of the other of said gate electrodes.

16. A method for making a master-slice type semiconductor integrated circuit device, according to claim 14, wherein:

after forming said gate electrodes, a second conductivity type of source region and a second conductivity type of drain region are formed in all active regions, and then the second conductivity type of source region and the second conductivity type of drain region formed in the active region on both sides of selected one of said gate electrodes are converted into a first conductivity type of source region and a first conductivity type of drain region, respectively.

17. A method for making a master-slice type semiconductor integrated circuit device, according to claim 16, wherein:

said gate electrode is formed as second conductivity type of silicon film on the gate insulating film, and said converting step from the second conductivity type of source region and the second conductivity type of drain region to the first conductivity type of source region and the first conductivity type of drain region, respectively is conducted under such conditions that the conductivity type of said second conductivity type of silicon film is not changed.

18. A method for making a master-slice type semiconductor integrated circuit device, according to claim 14, wherein:

the impurity concentration of a channel region is adjusted by implanting second conductivity type of impurity into the SOI layer located between a first conductivity type of source region and a first conductivity type of drain region.

19. A method for making a master-slice type semiconductor integrated circuit device, according to claim 13, wherein:

after forming said gate electrodes, a second conductivity type of source region and a second conductivity type of drain region are formed in the active region on both sides of selected one of said gate electrodes and a first conductivity type of source region and a first conductivity type of drain region are formed in the active region on both sides of the other of said gate electrodes.

20. A method for making a master-slice type semiconductor integrated circuit device, according to claim 19, wherein:

the impurity concentration of a channel region is adjusted by implanting second conductivity type of impurity into the SOI layer located between a first conductivity type of source region and a first conductivity type of drain region.

21. A method for making a master-slice type semiconductor integrated circuit device, according to claim 13, wherein:

after forming said gate electrodes, a second conductivity type of source region and a second conductivity type of drain region are formed in all active regions, and then the second conductivity type of source region and the second conductivity type of drain region formed in the active region on both sides of selected one of said gate electrodes are converted into a first conductivity type of source region and a first conductivity type of drain region, respectively.

22. A method for making a master-slice type semiconductor integrated circuit device, according to claim 21, wherein:

said gate electrode is formed as second conductivity type of silicon film on the gate insulating film, and said converting step from the second conductivity type of source region and the second conductivity type of drain region to the first conductivity type of source region and the first conductivity type of drain region, respectively is conducted under such conditions that the conductivity type of said second conductivity type of silicon film is not changed.

23. A method for making a master-slice type semiconductor integrated circuit device, according to claim 22, wherein:

the impurity concentration of a channel region is adjusted by implanting second conductivity type of impurity into the SOI layer located between a first conductivity type of source region and a first conductivity type of drain region.

24. A method for making a master-slice type semiconductor integrated circuit device, according to claim 21, wherein:

the impurity concentration of a channel region is adjusted by implanting second conductivity type of impurity into the SOI layer located between a first conductivity type of source region and a first conductivity type of drain region.

25. A method for making a master-slice type semiconductor integrated circuit device, according to claim 13, wherein:

the impurity concentration of a channel region is adjusted by implanting second conductivity type of impurity into the SOI layer located between a first conductivity type of source region and a first conductivity type of drain region.

* * * * *